United States Patent [19]

Benedict et al.

[11] 4,276,488
[45] Jun. 30, 1981

[54] MULTI-MASTER SINGLE-SLAVE ECL FLIP-FLOP

[75] Inventors: Douglas M. Benedict, Santa Monica; James R. Gaskill, Jr., Pacific Palisades, both of Calif.

[73] Assignee: Hughes Aircraft Company, Culver City, Calif.

[21] Appl. No.: 960,262

[22] Filed: Nov. 13, 1978

[51] Int. Cl.[3] .................... H03K 3/289; H03K 19/086
[52] U.S. Cl. ............................... 307/272 A; 307/289; 307/455
[58] Field of Search .................. 307/272 A, 289, 291, 307/223 R, 225 R, 203, 213, 218, 303, 243

[56] References Cited
U.S. PATENT DOCUMENTS 3,917,961 11/1975 Reed .................. 307/272 A Primary Examiner—John Zazworsky
Attorney, Agent, or Firm—Kenneth W. Float; William H. MacAllister

[57] ABSTRACT

Apparatus is provided comprising a plurality of master latches whose outputs are selectively connected to a single-slave latch. The outputs of the slave latch may be discretionarily connected to particular master latch inputs depending upon the specific circuit arrangement desired. Both the master latches and the slave latch may incorporate implicit input gating which implement particular logic functions.

14 Claims, 18 Drawing Figures

MULTI-MASTER SINGLE-SLAVE ECL FLIP-FLOP

BACKGROUND OF THE INVENTION

The present invention relates to computer logic circuits and, more particularly, to an array of multi-master single-slave flip-flop circuits which may be disposed on a single large-scale integrated circuit chip.

In conventional practice, two substantially identical latching circuits of the two-level cascode emitter-coupled logic type may be coupled together in series on a single integrated circuit chip. The first latching circuit serves as a master flip-flop, and the second latching circuit serves as a slave flip-flop. This master-slave combination has the advantage that it stores data reliably on the edge of a clock pulse, that is, at the clock pulse transition. Further, this master-slave arrangement provides the sequence master acquire then slave release which ensures that the output will change only if the new data stored in the master differs from data stored previously in the slave. This arrangement also provides the sequence slave latch then master release which ensures that data stored in the master will be captured in the slave before the master is released to acquire new data.

However, when it is desired to use the master-slave flip-flop in certain applications such as a J-K type flip-flop for example, feedback from the output to the input is necessary and the data input is a nontrivial logic function of external and fed back input signals. To implement the required logic function in conventional practice, a three-decision level cascode circuit may be employed as the latching circuit for the master flip-flop. However, in situations where the chip temperature varies over a wide range and the voltage supply is not abnormally regulated, this circuit arrangement is not reliable.

Alternatively in conventional practice, input gating to two-level cascode master-slave circuits may be performed by one or more external gating networks in series with the input. This arrangement has the disadvantage that a time delay is introduced which results in a slower speed.

More generally for operation over restricted temperature ranges both two-level and three-level cascode circuits have been coupled together to form single-master single-slave flip-flops. However, to perform specific logic functions, external gating networks typically have been used. Such is the case in conventional multiplexer and universal counter cells, for example. With the extra gating stage, the circuits are slower due to a time delay or propagation delay introduced by the external gating network.

Additionally, in some prior applications, a single three-level cascode master/single slave configuration was used in place of an external gating network/single two-level master/single slave configuration. The former configuration eliminates the gating delay but if operated under extreme temperature conditions, such as in a military type environment, or if power supply voltages are not held stable, the circuit may malfunction. For instance, at or near $-40°$ C., a three-level cascode circuit may become inoperative if the power supply voltage changes from $-5.2$ to $-4.8$ volts.

OBJECTS OF THE INVENTION

Accordingly, it is an object of the present invention to provide a master-slave flip-flop circuit arrangement for realization on a single integrated circuit chip employing only two-level cascode circuits which may be utilized in many different applications such as a J-K type flip-flop without using an intervening series gating circuit at the input.

Another object of the invention is the provision of a master-slave circuit arrangement which is relatively insensitive to variations in ambient temperature or supply voltage.

A further object of the present invention is to provide a master-slave flip-flop circuit arrangement which for limited (e.g., commercial) temperatures may be interconnected in a manner to form complex input gating functions such as required in multiplexer input master-slave flip-flops and universal counter cells, or the like, which has lower complexity and power dissipation and at the same time higher speed than conventional circuits.

SUMMARY OF THE INVENTION

In accordance with these and other objects of the invention, there is provided a multi-master single-slave flip-flop on an integrated circuit chip comprising a plurality of master latches whose outputs are selectively connected to a single slave latch. The outputs of the slave latch may be discretionarily connected to particular master latch inputs depending upon the specific circuit arrangement desired. Both the master latches and the slave latch may incorporate implicit input gating which implement particular logic functions. Generally, the implicit input gating is performed by incorporating multiple data input transistors as part of a two or three-level cascode circuit which provides the input gating.

If the logic function performed by a plurality of the master latches is such that all the master outputs are mutually disjoint, in that only one output is at a logic one level at any one time, then the outputs are wired in common to the slave latch, through what is commonly called a WIRE-OR connection. Thus, if the master logic functions $f_{M1}, f_{M2}, \ldots f_{MN}$ are mutually disjoint then the overall circuit outputs $Q$ and $\overline{Q}$ are given by $Q = QS$ and $\overline{Q} = \overline{QS}$ where $QS$ and $\overline{QS}$ are the slave outputs. If, however, the logic functions $\overline{f}_{M1}, \overline{f}_{M2}, \ldots \overline{f}_{MN}$ are mutually disjoint then $Q = \overline{QS}$ and $\overline{Q} = QS$, the complementary $Q$ and $\overline{Q}$ outputs are utilized as network outputs.

If the masters implement logic functions $\hat{f}_{M1}, \hat{f}_{M2} \ldots \hat{f}_{MN}$, where $\hat{f}_{M1} = f_{M1}$, or $\overline{f}_{M1}$, etc., and in addition the slave latch incorporates implicit input gating defined by the logic function $F_S$, then master outputs which are equivalent to $f_{M1}, \ldots f_{MN}$ are fed to slave inputs. The composite network function is given by $Q(n+1) = F_S(\hat{f}_{M1}, \hat{f}_{M2}, \ldots \hat{f}_{MN})$, and the outputs are given by $Q = QS$ and $\overline{Q} = \overline{QS}$. If $\hat{f}_{MK} = f_{MK}$ then the kth master $Q$ output $Q_{MK}$ is fed to the kth slave input. If $\hat{f}_{MK} = \overline{f}_{MK}$, then the Kth master $\overline{Q}$ output $\overline{Q_{MK}}$ is fed to the Kth slave input. If, however, the composite network function $Q(n+1) = \overline{F}_S(\hat{f}_{M1}, \hat{f}_{M2}, \ldots \hat{f}_{MN})$ using the specific implicit master functions $\hat{f}_{M1}, \hat{f}_{M2}, \ldots \hat{f}_{MN}$ and complement implicit slave input function $\overline{F}_S$, then the reversed slave outputs ($Q = \overline{QS}$, $\overline{Q} = QS$) are used as external outputs. If $\hat{f}_{MK} = f_{MK}$, then the Kth master $Q$ output $Q_{MK}$ is fed to the Kth slave input. If $\hat{f}_{MK} = \overline{f}_{MK}$, then the Kth master $\overline{Q}$ output $\overline{Q_{MK}}$ is fed to the Kth slave input.

BRIEF DESCRIPTION OF THE DRAWINGS

The invention, including its various objects, features and advantages, may be more readily understood with reference to the following detailed description of several embodiments, taken in conjunction with the accompanying drawings, wherein like reference numerals designate like structural elements, and in which.

DETAILED DESCRIPTION OF THE INVENTION

Figure 1:
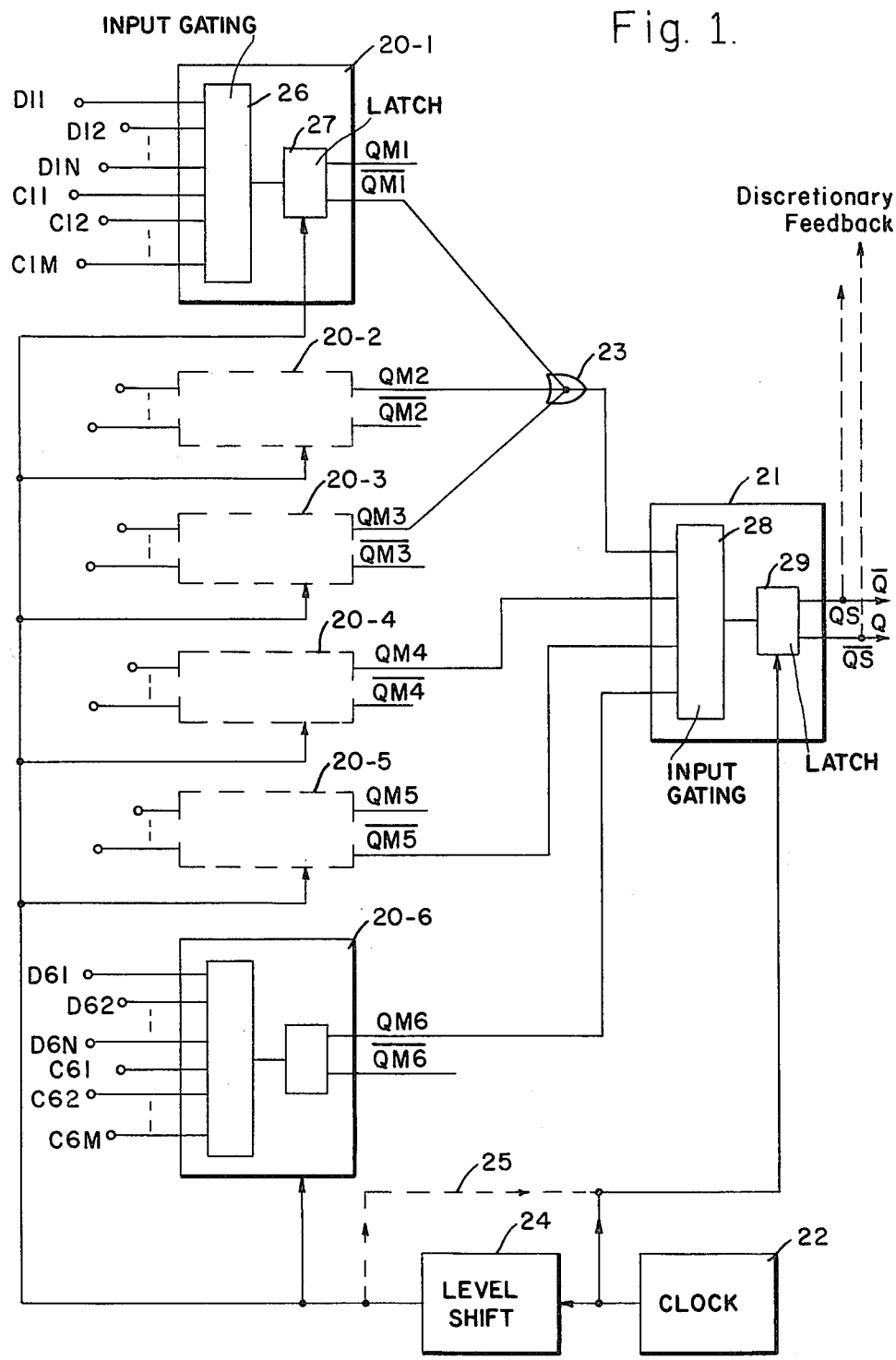
FIG. 1 is a multi-master single-slave flip-flop made in accordance with the present invention.

Referring now to FIG. 1, there is shown a multi-master single-slave flip-flop circuit made in accordance with the present invention. A plurality of parallel master latch networks 20-1 to 20-6 (hereinafter called masters) have their respective Q or $\overline{Q}$ outputs QM1 to QM6 or $\overline{QM1}$ to $\overline{QM6}$ connected to the inputs of a slave latch network 21 (hereinafter called slave). The $\overline{Q}$ output $\overline{QM1}$ and Q outputs QM2 and QM3 of the masters 20-1, 20-2 and 20-3 are connected in common through WIRE-OR gate 23 to a single slave input. A WIRE-OR gate is not a gate at all, but a point of common connection between the master emitter-follower outputs QM1, QM2 and QM3 and a pull down resistor (not shown) connected to VEE, the power supply voltage. Because the emitter followers act as voltage sources, the common output WIRE-OR node (WIRE-OR gate 23) will be high at logic 1 if any of the individual outputs $\overline{QM1}$, QM2, or QM3 is high. The node will be low or at logic 0 only if all of the individual outputs are low. The remaining masters 20-4 to 20-6 have their Q or $\overline{Q}$ outputs connected to separate data inputs of the slave 21. A clock 22 is coupled to the slave 21 and by way of a level shift circuit 24 to the plurality of masters 20-1 to 20-6. The clock 22 may be coupled to the slave 21 through the level shift circuit 24 by means of dashed connection 25.

The masters 20-1 to 20-6 have a plurality of data inputs designated D11, D12, . . . D1N for the first master 20-1, D21, D22, . . . D2N for the second master 20-2 and so forth, with D61, D62, . . . D6N being the data inputs for the sixth master 20-6. A similar set of control inputs C11, C12, . . . C1M, C21, C22, . . . C2M, to C61, C62, . . . C6M is also provided for each of the masters 20-1 to 20-6. Each master 20-1 to 20-6 has two data outputs designated QM1 and $\overline{QM1}$ for the first master 20-1, QM2 and $\overline{QM2}$ for the second master 20-2, and so forth.

The master 20-1 is also shown having implicit input gating circuitry 26 which may include multiple D input transistors, a series gating provision, or the like, coupled to a latch circuit 27. The latch circuit 27 provides the Q and Q outputs QM1 and $\overline{QM1}$ of the master 20-1.

The slave 21 has a multiplicity of data and control inputs coupled to the Q outputs of the masters 20-1 to 20-6. The slave 21 also has two outputs designated QS and $\overline{QS}$. The slave 21 may also include multiple input transistors or implicit input series gating circuitry 28 coupled to a latch circuit 29. This allows a more complex overall circuit network function to be implemented by the multi-master single-slave flip-flop circuit.

It is to be understood that FIG. 1 represents a specific embodiment of the present invention and is not to be taken as limiting. In accordance with the present invention, the respective outputs of the masters 20-1 to 20-6 indicated above as QM1 to QM6 and $\overline{QM1}$ to $\overline{QM6}$ may be discretionarily connected to the inputs of the slave 21, depending upon the overall circuit logic function which the circuit implements. Discretionary, as used herein, means that although many possible connections may be made depending upon the circuit configuration, certain choices must be made to implement, for instance, a J-K flip-flop circuit, and once the particular circuit is chosen, the discretionary connections become hard-wired connections as part of an ECL IC chip. In a similar manner the outputs of the slave 21 may be discretionarily connected to its own input or to the inputs of the masters 20-1 to 20-6, depending upon the circuit configuration desired. Additionally, six masters are shown, but the circuit is not restricted to that many. Any number of masters may be utilized, up to limits imposed by circuit design considerations, to implement a desired circuit logic function.

Figure 2:
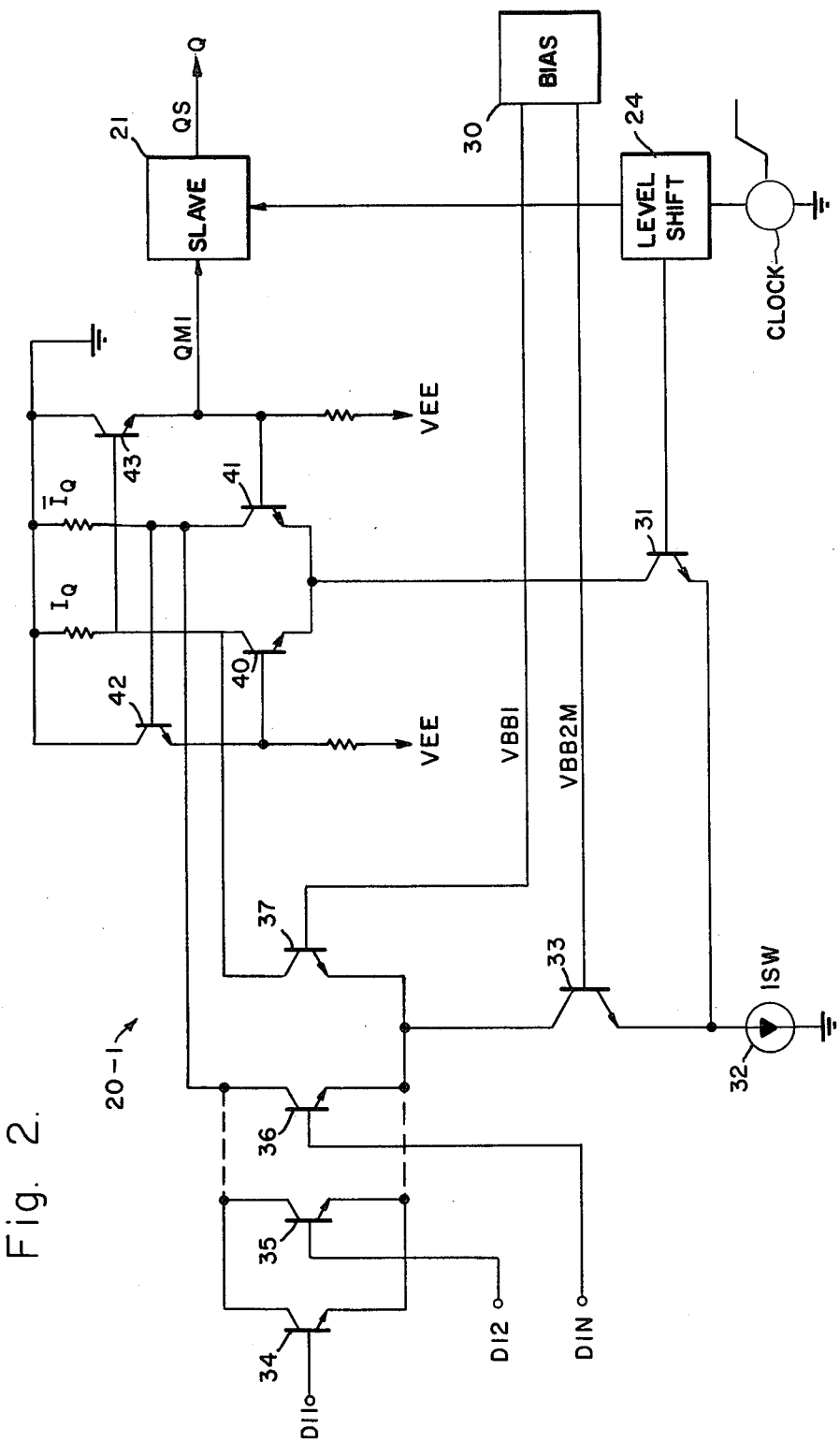
FIG. 2 is a simplified master-slave flip-flop circuit incorporating a two-level cascode master.

In order to more particularly point out the novel aspects of the present invention, a brief introduction to the operation of simple emitter coupled logic (ECL) flip-flop circuits is provided hereinbelow. FIG. 2 shows a simplified master-slave flip-flop circuit, the master of which is shown in some detail. The master incorporates a two-level cascode circuit comprising lower current switch transistors 31 and 33, multiple D input transistors 34-36 and transistor 37 forming an input upper current switch and a latch circuit comprising transistors 40-43 forming a second upper current switch. The construction of this circuit will not be described since it is well known in the art.

Generally, however, the circuit of FIG. 2 operates in the following manner. The master steers current (ISW) from a constant current source 32 through the lower switch transistors 31 and 33. When the clock is low so that the level shifted clock is approximately 0.4 volts below VBB2M, ISW flows through transistors 33 and then to paths provided by the multiple D input transistors 34–36 and transistor 37. Thus, when the clock is low, if any of the D inputs D11 to D1N are high or approximately 0.4 volts above VBB1, current will flow from the current source 32 through transistor 33 and through the input transistor made conductive by the high data input. When the clock is low and all data inputs are low or approximately 0.4 volts below VBB1, current flows from the current source 32 through transistor 33 and then through transistor 37. Reference voltages VBB1 and VBB 2 are supplied from bias network 30.

When the clock is high the level shifted clock is approximately 0.4 volts above VBB2M and switch current is fed through lower current switch transistor 31. In that case, the latch circuit comprising transistors 40–43 is active and stores the data previously input at D11-D1N. Transfer of input data occurs at and following a positive going clock signal transition applied to transistor 31. The latch circuit holds the data as long as the clock signal is high. When the clock falls to a low value, the latch is turned off and concurrently the input upper current switch is activated.

Figure 3:
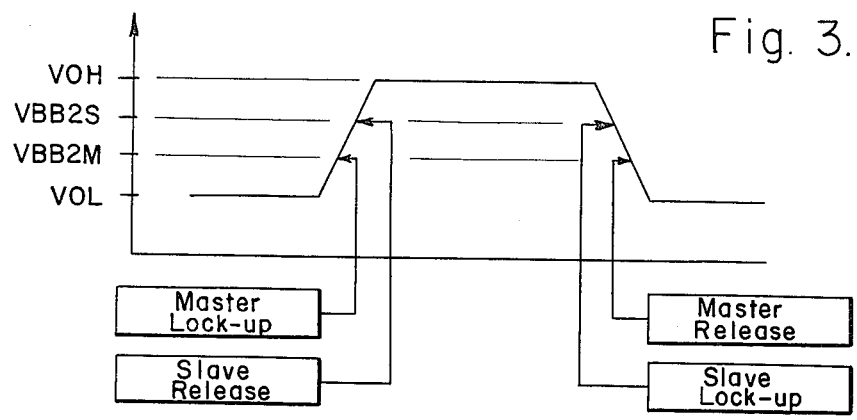
FIG. 3 illustrates the transfer characteristics of a master-slave flip-flop.

A slave 21 is configured using a two-level cascode circuit similar to that used in the master 20-1 shown in FIG. 2. However, in a slave circuit, clock connections to the lower current switch are reversed. In the slave 21, the level shifted clock signal is applied to the lower current switch transistor 33 feeding the input upper switch 34–37 and a reference voltage is fed to the other lower current switch transistor 31. Also, in the slave 21, the lower current switch reference voltage (VBB2S in a slave 21 rather than VBB2M in a master 20-1) is provided such that VBB2M is approximately 100 mV higher than VBB2S. With these differences relative to the master 20-1, the slave input upper current switch is active when its clock input is high. As the clock input to the slave 21 falls, current is transferred from the input current switch to the latch upper current switch in the slave 21 and the latch regenerates storing the slave data input. Because VBB2S is slightly higher than VBB2M, transfer of current in the slave lower current switch takes place slightly delayed relative to master lower current switch transitions on rising clock edges and slightly advanced relative to master lower current switch transitions on falling clock edges. As a result, the transfer characteristics of a master-slave flip-flop combinations are as shown in FIG. 3. Therein, VOL identifies the low or logic 0 voltage and VOH identified the high or logic 1 voltage. VBB2M and VBB2S are the lower current switch reference voltages fed to master 20-1 and slave 21 flip-flops identified previously.

Referring to FIG. 3, as the clock signal rises toward VOH, it attains the value VBB2M at which time the master 20-1 latches its input data. Then as the clock signal rises further to VBB2S the slave 21 releases while data is transferred from the slave latch circuit to the slave cascode network. Then, the slave cascode network transfers the data latched in the master 20-1 to the slave outputs (QS, $\overline{QS}$). At this point, the slave outputs will change state if the new data stored in the master 20-1 are different from data stored in the slave 21. The sequence master 20-1 acquire then slave 21 release ensures that the output will not change state unless data in the master 20-1 differs from data stored previously in the slave 21.

As the clock signal falls from VOH to VBB2S, the slave 21 latches to acquire the master output. Then as the clock signal falls further toward VBB2M, the master 20-1 releases, and acquires new data. The sequence slave 21 latch then master 20-1 release ensures that the data stored in the master 20-1 will be captured in the slave 21 before the master 20-1 is released to acquire new data.

Figure 4:
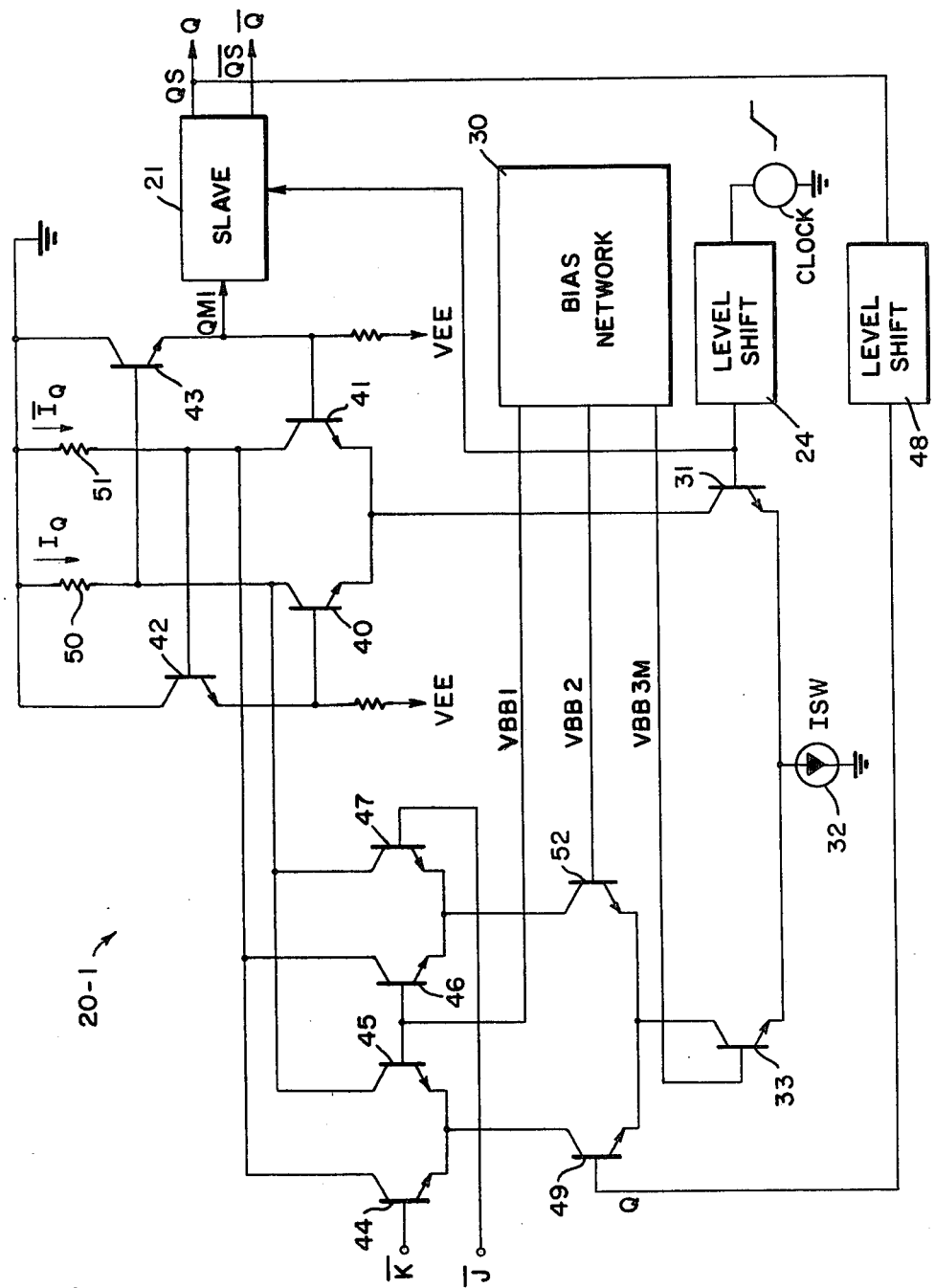
FIG. 4 is a master-slave flip-flop utilizing a three-level cascode master.

In addition to two-level cascode master and slave circuits, similar master and slave elements also may be built using three-level cascode circuits. In particular, three-level cascode circuits may be used to perform additional logic gating in series with data inputs without appreciably increasing the time delay through the circuit. One such circuit is shown in FIG. 4, the master of which is shown in some detail. This particular circuit is a simplified version of a commercially available series dual J-K master-slave flip-flop, Model 10135. The construction of this circuit will not be described since it is well known in the art.

Generally, however, the circuit of FIG. 4 operates in the following manner. The master 20-1 steers current from a constant current source 32 through lower current switch transistors 31 and 33. If the clock is low so that the level shifted clock is approximately 0.4 volts below VBB3M, then switch current ISW from the current source 32 flows through transistor 33 and then through a second current switch transistors 49 and 52 connected to two third or upper current switch transistors 44, 45 and transistors 46, 47. Transistors 33 in series with 42, 43, in series with 44–47 make up a three-level cascode circuit. The current is controlled by data inputs $\overline{J}$ and $\overline{K}$ along with control input Q, the output of the slave 21, and the level shifted clock signal provided at transistor 31. Bias voltages are supplied by the bias network 30.

In the specific embodiment of FIG. 4, the data inputs D11 and D12 are relabeled to $\overline{J}$ and $\overline{K}$ as is conventional in a J-K flip-flop. Additionally, the slave output QS=Q is level shifted by a level shift circuit 48 and connected to the base of transistor 49. Thus, whereas connection of the QS and $\overline{QS}$ outputs are discretionary in the general case, in this specific circuit the QS output is connected to the transistor 49 as indicated.

When the clock is low, the path which the current takes is determined by the conductive or non-conductive state of the transistors 31, 33, 49, 52, 44–47 of the three stage cascode circuit. The conductive state of a particular transistor is determined by the logic state (high or low) of the controlling inputs. Thus, for example, when the clock is low, if Q=QS is high, transistor 49 conducts and if, in addition, $\overline{K}$ is high, then transistor 44 conducts and the current flows through transistors 44, 49, 33 and current source 32. A Boolean equation for the current is given by $\overline{I_Q}=\overline{K}QS$. In this equation, each variable is true (logic 1) if current is flowing and false (logic 0) otherwise. If $\overline{K}$ is low while QS is high, then with the clock low, current flows through transistors 45, 49 and 33 from the current source 32, and therefore, the equation for the current is given by $I_Q=KQS$.

If, on the other hand, with the clock low and $\overline{QS}$ high, transistor 52 conducts, and depending on whether or not $\overline{J}$ is high, the current flows through transistors 46 or 47, respectively. In the case where $\overline{J}$ is low and $\overline{QS}$ is high, the Boolean equation for the current is given by $\overline{I_Q}=\overline{QS}\overline{J}$. Similarly, if $\overline{J}$ is high and $\overline{QS}$ is high, the current function is $\overline{I_Q}=\overline{QS}\,J$.

Only a single source of switch current is incorporated in master and slave latch circuits. This is fed either to load resistor 50 or load resistor 51 of the latch circuit shown in FIG. 4. Thus, either $I_Q=1$ and $\bar{I}_Q=0$ or $I_Q=0$ and $\bar{I}_Q=1$, and as such, $I_Q$ and $\bar{I}_Q$ are logical complements.

The output voltages developed across load resistors 50 and 51 are the logical complements of the currents flowing through the load resistors. Thus, $V_Q=1$ when $I_Q=0$ and conversely. Similarly, $\bar{V}_Q=1$ when $\bar{I}_Q=0$ and conversely. $\bar{V}_Q$ is developed at the emitter of transistor 42 in the circuit shown in FIG. 4, but not used as an external output.

Combining the fact that $I_Q$ and $\bar{I}_Q$ are logical complements and the fact that each output voltage is the logical complement of its corresponding output current yields the equations $I_Q=\bar{V}_Q$ and $\bar{I}_Q=V_Q$. In other words, the logic equation for the current $I_Q$ in load resistor 50 is the same as the logic equation for the $\bar{Q}$ voltage output at the emitter of 42 and the logic equation for the current $\bar{I}_Q$ is load resistor 51 is the same as the logic equation for the Q voltage output $V_Q$ or QM1 at the emitter of transistor 43. Hence, an analysis of the conditions required for $\bar{I}_Q=1$ given above, $\bar{I}_Q=Q\bar{K}+\bar{Q}J$, yields the logic equation for $V_Q=$QM1, namely $$\bar{I}_Q=Q\bar{K}+\bar{Q}J=V_Q$$

and similarly $$I_Q=QK+\bar{Q}\bar{J}=\bar{V}_Q$$

where $I_Q$ is the current flowing through resistor 50 and $\bar{I}_Q$ is the current flowing through resistor 51. The first equation for $V_Q$ is the defining equation for a conventional J-K flip-flop.

The latch circuit comprising transistors 40–43 stores the data provided by the three-level cascode circuit at and following a positive going clock transition. The latch holds as long as the clock is high, then the latch circuit releases the stored data on a downward clock transition which is transferred to the slave 21.

The slave 21 is substantially the same as the master 20-1 except that the bias voltage (VBB2M) supplied to the lower current switch of the master 20-1 is 100 millivolts lower than the bias voltage (VBB2S) supplied to the lower current switch of the slave 21. Additionally, clock signals are fed to the right side of the master lower current switch while fed to the left side of the slave lower current switch.

Thus, a generalized description of the operation of simple master-slave flip-flops incorporating both a two-level and three-level cascode circuits has been provided to introduce ECL master and slave flip-flop circuits and their operation. Hereinbelow, two factors will be important to note in connection with two and three-level cascode flip-flop elements. In two-level cascode master and slave circuits, input OR-gating is performed implicitly, with no increase in delay through the circuit, by a plurality of D input transistors connected in parallel. More complex gating functions may be performed implicitly through series gating in three-level cascode input circuits, again with no significant increase in delay through the circuit. Thus, for selected applications, three-level cascode usage is preferred. However, a second factor limits use of three-level cascode circuits.

Specifically, unless power supply voltages are specially regulated, two-level cascode circuits may operate over a wider range of IC temperatures than three-level cascode circuits. In particular, for normal power supply voltage regulation, for example 10%, three-level cascode circuits do not operate properly at temperatures below approximately 0° C. whereas two-level cascode circuits may operate satisfactorily to temperatures below −40° C. Thus, two-level cascode circuits are more often utilized in ICs designed for military equipment to operate over a −40° C. to +100° C. range whereas three-level cascodes may be restricted to ICs for use in commercial equipment, which operate over a 0°–100° C. range.

The difficulty with three-level cascode circuits at low temperature may be illustrated through a comparison of the circuits shown in FIGS. 2 and 4. At low temperature, say −40° C., the VBE (the voltage drop between base and emitter) of each transistor conducting ISW is approximately 1 volt (rather than 0.8 volts at 25° C.). The current source 32 shown in FIGS. 2 and 4 is normally implemented by a transistor and an emitter resistor connected to VEE. The voltage drop across the current source transistor and the emitter resistor normally totals 1.5 volts. Thus, the collector of this current source transistor, connected at the emitters of transistors 31 and 33 will be about 1.5 volts above VEE. This 1.5 volts adds to the voltage drops through the other transistors and also the load resistor connected in series to VCC.

Thus, the total voltage drop from VCC to VEE will be the voltage across a load resistor, the VBE drops across transistors 37 and 33, and the 1.5 volts across current source 32. In the circuit shown in FIG. 2, the drop across a load resistor is normally 0.8 volts. Thus, the total drop is 0.8 volts+2VBE+1.5 volts or 4.3 volts with VBE=1 volt at −40° C. If the net power supply voltage VCC-VEE is normally 5.2 volts and is regulated to −10%, then VCC-VEE may fall to 5.2-0.52 or approximately 4.8 volts. Then the total series voltage through the circuit (about 4.3 volts) is only 0.5 volts less than the total 4.8 net supply voltage.

If a three-level cascode circuit is used, an additional VBE drop is added in series. For example, in the circuit of FIG. 4, the total drop would be the sum of voltage across current source 32 (1.5 volts), plus the voltage across a load resistor (0.8 volts) plus three VBE drops (about 3 volts) across transistors 45, 49, and 33. Then in this case, the total drop across the circuit would be 5.3 volts or about 0.5 volts more than the net supply voltage. This would cause the circuit to saturate and malfunction, resulting in a drastic reduction in circuit speed.

In view of the above, two-level cascode circuits may be designed into ICs for military equipment. More logically powerful three-level cascode circuits may be designed into ICs for operation in commercial equipment. Accordingly, multi-master single-slave configurations are described herein for realization using both two-level cascode and three-level cascode circuits.

Generally speaking, a multi-master single-slave flip-flop is a network consisting of a plurality of N masters feeding a single slave. The network includes disretionary connection means for connecting selected data inputs to a set of external inputs, for connecting slave outputs to external outputs and for connecting external outputs to selected master inputs. Each master and the slave may incorporate circuitry for implicit logical operations, such as series gating and parallel D-input transistors connected to realize an implicit OR function in three-level cascode circuits, with little or no increase in delay relative to a single D-input master.

In multi-master single-slave flip-flop circuits built for military applications, only two-level cascode circuit master and slave circuits may be used. In such cases multiple D-input transistors but no additional series gating is available in master or slave elements. In this case, a parallel array of N master latch elements is configured. The data inputs (D inputs) to the first master are designated D11, D12, ..., D1K, D inputs to the second master are D21, D22, ..., D2K and D inputs to the Nth master are DN1, DN2, ..., DNK.

The master complement outputs $\overline{QM1}$, $\overline{QM2}$, ..., $\overline{QMN}$ are connected together to a pull-down resistor forming a WIRE-OR gate and fed to the input (DS) of a single slave. Complements of slave outputs QS and $\overline{QS}$ are used to form the Q and $\overline{Q}$ outputs of the multi-master single-slave flip-flop. In other words, $Q = \overline{QS}$ and $\overline{Q} = QS$.

With multiple OR connected data input transistors in each master, master D input functions are given by:

$$
\left.\begin{aligned}
DM1(n) &= D11(n) + D12(n) + \ldots + D1K(n) = \sum_{J=1}^{K} D1J(n) \\
DM2(n) &+ D21(n) + D22)(n) + \ldots + D2K(n) = \sum_{J=1}^{K} D2J(n) \\
&\vdots \\
DMN(n) &= DN1(n) + DN2(n) + \ldots + DNK(n) = \sum_{J=1}^{K} DNJ(n).
\end{aligned}\right\} \quad (1)
$$

A common clock signal is fed to all masters and the slave, although the voltage levels may be different. The flip-flop elements themselves may be any ECL circuits with the following property. When the clock is low, during cycle n, (following the nth positive clock edge) the masters acquire and track their D inputs. Concurrently, the slave stores its input data. At their next positive clock edge, initiating cycle n+1 all master D inputs are latched. Only after master lock up, the slave releases and passes its input DS(n+1) to its output QS(n+1). Thus, at and following the clock edge, $$DS(n+1) = QS(n+1) \quad (2)$$

As the clock falls, during cycle n+1, the slave latches storing DS(n+1). After slave latch-up, the masters release and acquire new inputs DM(n+1).

Given the above property, at and following the clock edge initiating cycle n+1, master Q outputs are held at their previous data input states, Thus, $$
\left.\begin{aligned}
QM1(n+1) &= DM1(n) = \sum_{J=1}^{K} D1J(n) \\
QM2(n+1) &= DM2(n) = \sum_{J=1}^{K} D2J(n) \\
&\vdots \\
QMN(n+1) &= DMN(n) = \sum_{J=1}^{K} DNJ(n).
\end{aligned}\right\} \quad (3)
$$

Master complement outputs $\overline{QM1}$, $\overline{QM2}$, ... $\overline{QMN}$ are WIRE-OR connected and fed to the slave D-input, as noted previously. Therefore, $$DS(n+1) = \overline{QM1(n+1)} + \overline{QM2(n+1)} + \ldots + \overline{QMN(n+1)} \quad (4)$$

Hence from Equation (2), slave Q output QS(n+1) is given by $$QS(n+1) = \overline{QM1(n+1)} + \overline{QM2(n+1)} + \ldots + \overline{QMN(n+1)} \quad (5)$$

The complement slave Q output, $\overline{QS(n+1)}$ is used as the uncomplemented network output Q(n+1) and conversely; i.e., $$Q(n+1) = \overline{QS(n+1)} \text{ and } \overline{Q(n+1)} = QS(n+1) \quad (6)$$

Thus, $$\overline{Q(n+1)} = QS(n+1) = \overline{DS(n+1)} = \overline{\overline{QM1(n+1)} + \overline{QM2(n+1)} + \ldots + \overline{QMN(n+1)}}. \quad (7)$$

Equivalently using deMorgan's theorem, $$Q(n+1) = [QM1(n+1)][QM2(n+1)] \ldots [QMN(n+1)]. \quad (8)$$

Then using Equation (1) above, $$Q(n+1) = \left[\sum_{J=1}^{K} D1J(n)\right]\left[\sum_{J=1}^{K} D2J(n)\right]\ldots\left[\sum_{J=1}^{K} DNJ(n)\right]. \quad (9)$$

An equivalent form of Equation (9), useful in design of multi-master single-slave flip-flop networks is derived by complementing equation (1) and using them in equation (7) top obtain $$\overline{Q(n+1)} = \sum_{J=1}^{K} \overline{D1J(n)} + \sum_{J=1}^{K} \overline{D2J(n)} + \ldots + \sum_{J=1}^{K} \overline{DNJ(n)}. \quad (10)$$

Equation (10) in effect expresses the complement function $\overline{Q(n+1)}$ as a sum of products of the complements of the signals fed to each master D-input. Thus given a required equivalent network function of external inputs $$\{X1J(n)\}_{J=1}^{K}, \{X2J(n)\}_{J=1}^{K}, \ldots, \{XNJ(n)\}_{J=1}^{K}$$

fed to first, second, ..., and Nth masters, one may find a cover for the zeros of the function Q(n+1), for example using a Karnaugh map, and therefore express $\overline{Q(n+1)}$ as $$\overline{Q(n+1)} = \sum_{J=1}^{K} X1J(n) + \sum_{J=1}^{K} X2J(n) + \ldots + \sum_{J=1}^{K} XNJ(n). \quad (11)$$

Then connecting signals complemented relative to the arguments in this expression, such as by connecting $$\{\overline{X1J(n)}\}_{1}^{K}, \{\overline{X2J(n)}\}_{2}^{K}, \{\overline{XNJ(n)}\}_{1}^{K}$$

respectively to the first, second and ... Nth master D-inputs will result in multi-master single-slave flip-flop network generation of the required function.

Application of equations 1-9, in several examples of multi-master single-slave flip-flop networks are given hereinbelow. These examples also illustrate the simplified design approach possible using Karnaugh maps and the relationship of equation (10).

Three-level cascode circuits do not operate properly over the full military equipment temperature range as noted previously. Hence, two-master single-slave networks should be used when the military temperature range is required. However, three-level cascode operation is satisfactory in commercial applications such as general purpose computers. Thus, in these applications three-level cascode masters may be incorporated in multi-master single-slave flip-flop networks to reduce complexity and power dissipations while retaining single-stage delay performance.

A more general definition of a multi-master single-slave flip-flop network applicable to implementation using three-level cascode circuits is given hereinbelow.

A multi-master single-slave flip-flop comprises a plurality of N masters feeding a single-slave along with discretionary connection means. Master and slave circuits are fed by a common clock. They exhibit master latch then slave release timing at positive clock edges, and slave latch then master release at negative clock edges. A plurality of D inputs (D) and a plurality of control inputs (C), $$\{D11, D12, ..., D1K; C11, C12, ..., C1M\},$$
$$\{D21, D22, ..., D2K; C21, C22, ..., C2M\},$$
$$\vdots$$
$$\{DN1, DN2, ..., DNK; CN1, CN2, ..., CNM\},$$

are fed to first, second, ..., Nth master D-inputs respectively. The masters implement the logic functions as shown in FIG. 1.

$$\left.\begin{array}{l} QM1 = f_{M1}(D11, D12, ..., D1K; C11, C12, ..., C1M) \\ QM2 = f_{M2}(D21, D22, ..., D2K; C21, C22, ..., C2M) \\ \vdots \\ QMN = f_{MN}(DN1, DN2, ..., DNK; CN1, CN2, ..., CNM) \end{array}\right\} \quad (12)$$

through special embedded circuitry with approximately no increase in master delay, compared with the delay of a single input master built or used subject to the same design constraints.

If the functions $f_{M1}, f_{M2}, ..., f_{MN}$ with their particular input variables are mutually disjoint, such that only one function can be at a logic 1 value at a time, master Q outputs are WIRE-OR connected and fed to the slave DS input. Then slave outputs are used directly as network outputs, such that $Q=QS$ and $\overline{Q}=\overline{QS}$.

In this case $$Q(n + 1) = QS(n + 1) = \sum_{J=1}^{N} QMK(n) \quad (13)$$

where QMK(n) for K=1 through N are given in equation (12).

If the complement master function, $\bar{f}_{M1}, \bar{f}_{M2}, ..., \bar{f}_{MN}$ are mutually disjoint, then master complement output signals $\overline{QM1}, \overline{QM2}, ..., \overline{QMN}$ are WIRE-OR connected and fed to slave DS input. Then slave outputs are complemented and used as network outputs, such that $Q=\overline{QS}$ and $\overline{Q}=QS$. In this case, $$Q(n + 1) = \overline{QS(n + 1)} = \overline{\sum_{J=1}^{N} \overline{QMK(n)}} \quad (14)$$

where QMK(n) for K=1 through N are given in equation (12).

If the slave latch has provision for performing the input function $F_S(DS1, DS2, ... DSN)$, then for the same general conditions given above, multi-master single-slave flip-flop networks may be configured in the following manner.

If the composite network function Q(n+1) may be expressed as $$Q(n+1) = F_S(\hat{f}_{M1}, \hat{f}_{M2}, ..., \hat{f}_{MN}) \quad (15)$$

using the specific implicit master and slave input functions $\hat{f}_{M1}, \hat{f}_{M2}, \hat{f}_{MN}$ and $F_S$ respectively realizable with available master and slave circuits, the non-reversed slave outputs are used as external networks. Thus, $Q=QS$ and $\overline{Q}=\overline{QS}$. In the above expression, $\hat{f}_{Mk}=$ either $f_{Mk}$ or $\bar{f}_{Mk}$. If $\hat{f}_{Mk}=f_{Mk}$ then the kth master Q output QMk is fed to the kth slave input. If $\hat{f}_{Mk}=\bar{f}_{Mk}$, then the kth master $\overline{Q}$ output $\overline{QMk}$ is fed to the kth slave input.

If the composite network function may be expressed as $$Q(n+1) = \overline{F}_S(\hat{f}_{M1}, \hat{f}_{M2}, ..., \hat{f}_{MN}) \quad (16)$$

using the specific implicit master input function $\hat{f}_{M1}, \hat{f}_{M2}, ..., \hat{f}_{MN}$ and complement implicit slave input function $\overline{F}_S$, then reversed slave outputs are used as external outputs. Thus, $Q=\overline{QS}$ and $\overline{Q}=QS$. In the above expression, $\hat{f}_{Mk}=$ either $f_{Mk}$ or $\bar{f}_{Mk}$. If $\hat{f}_{Mk}=f_{Mk}$, then the kth master Q output QMk is fed to the kth slave input. If $\hat{f}_{Mk}=\bar{f}_{Mk}$, then the kth master $\overline{Q}$ output, $\overline{QMk}$ is fed to the kth slave input.

Figure 5A:
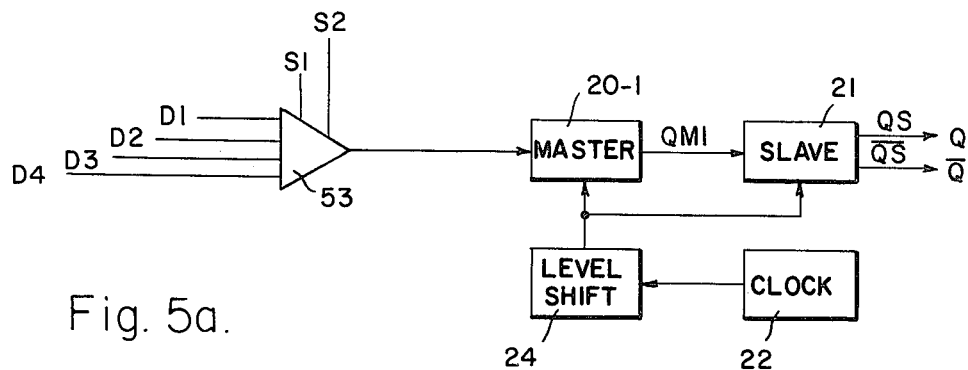
FIG. 5a shows a conventional multiplexer circuit.
Figure 5B:
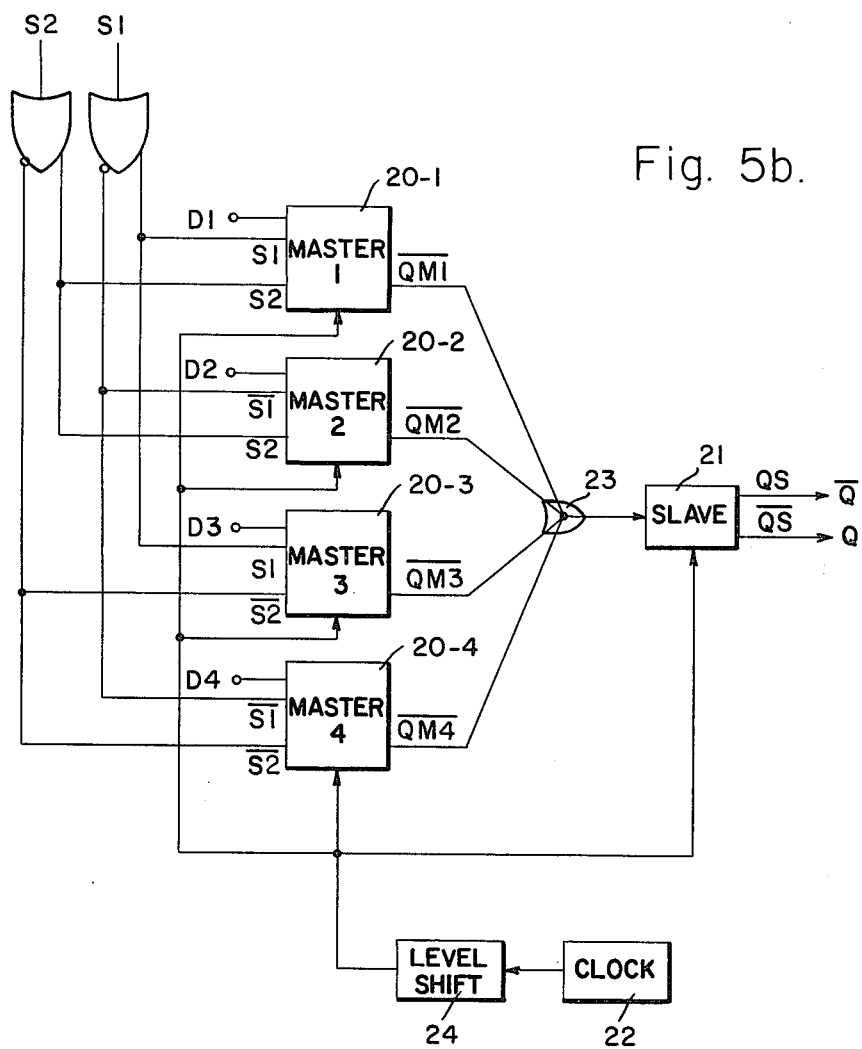
FIGS. 5b and 5c show multiplexer circuits made in accordance with the present invention.
Figure 5C:
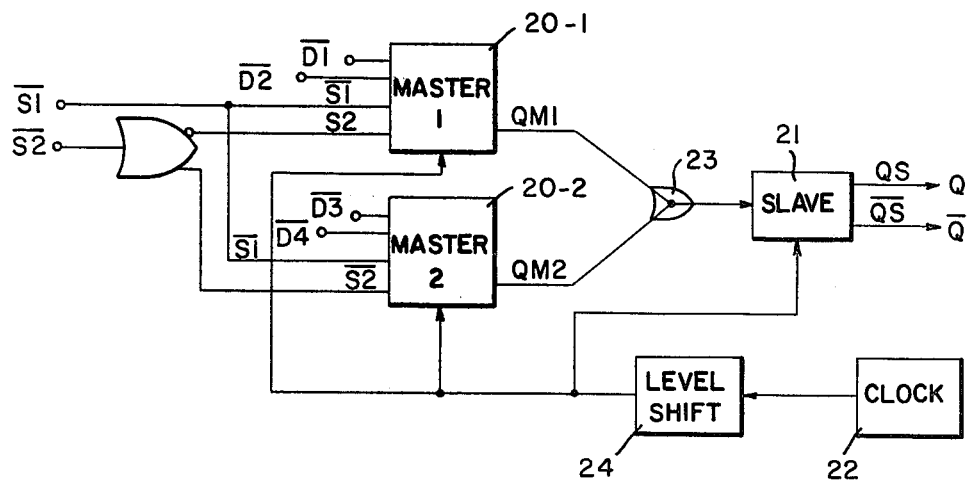
Figure 5D:
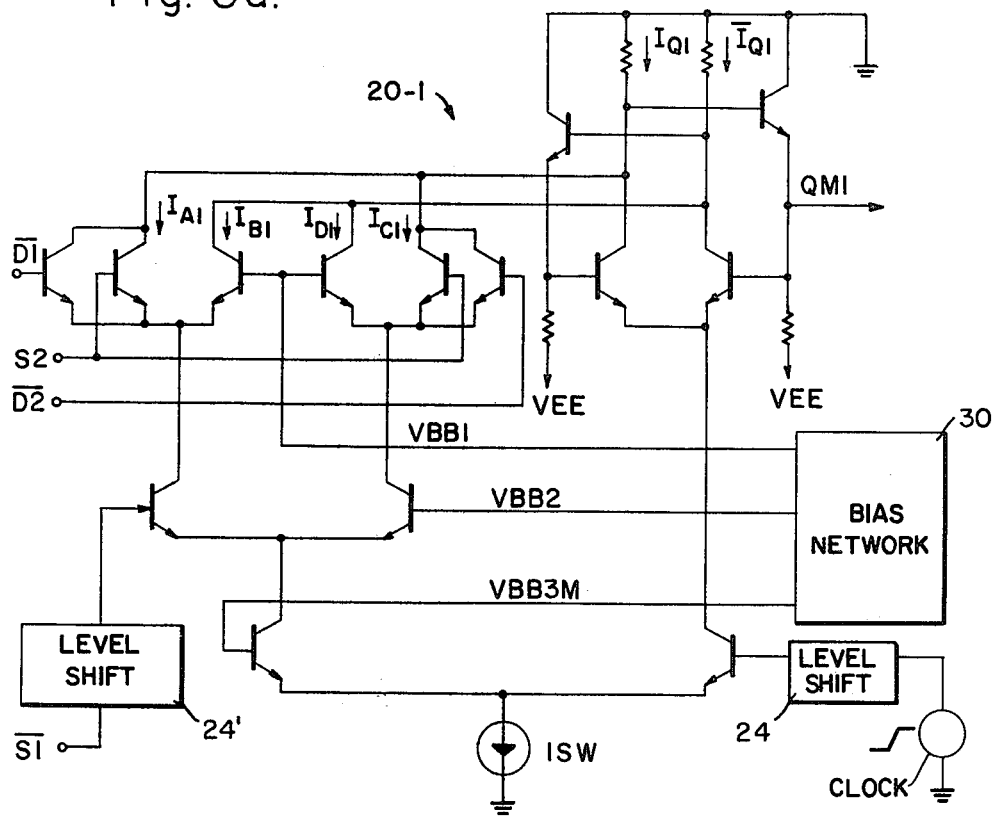
FIG. 5d shows a three-level cascode master suitable for use in the circuit of FIG. 5c.

An appreciation of the features of the present invention will be more readily apparent when explained with reference to FIGS. 5a to 5d. FIG. 5a shows a conventional multiplexer/flip-flop circuit while FIGS. 5b, 5c show logically equivalent multiplexer/flip-flops made in accordance with the present invention. FIG. 5d shows a three-level cascode master suitable for use in the circuit of FIG. 5c.

Referring now to FIG. 5a, there is shown a multiplexer 53 having four data inputs (D1–D4), two select inputs (S1, S2) and an output which is coupled to the input of the master 20-1. The Q output of the master 20-1, QM1, is coupled to the slave 21. The clock 22 couples level shifted clock signals to the master 20-1 and to the slave 21 through the level shift circuit 24. The slave 21 has outputs QS and $\overline{QS}$.

In operation, input signals are applied to the data inputs D1–D4 of the multiplexer 53. On command from external signals applied to the S1 and S2 select inputs, in the sequence 0,0; 0,1; 1, 0; 1, 1, data is transferred from the D1 through D4 inputs of the multiplexer 53 to the master 20-1 and hence to the slave 21. Thus, for example, when S1, S2=0,0 data fed to D1 is selected and stored. When S1, S2=0,1 D2 data is selected and stored in a similar manner. Thus, the multiplexer implements the master data input selection function $$DM = \overline{S1}\,\overline{S2}\,D1 + S1\overline{S2}D2 + \overline{S1}S2D3 + S1S2D4.$$

Master slave flip-flop operation insures that DM(n)+Q(n+1).

In conventional implementation of the multiplexer function, a gating network is used to realize the multiplexer 53. Thus, there is a propagation delay in the multiplexer 53 due to the time required to transmit data through the multiplexer 53. This delay is due to the multiplexer 53 being one or more gating stages in the data path.

Referring now to FIGS. 5b and 5c, there are shown networks for performing the same multiplexer function (logically speaking) which eliminate the extra gating delay and thus are faster circuits. The basic configuration of these circuit are as described in connection with FIG. 1. The network shown in FIG. 5b may be implemented using only two-level cascode master and slave circuits whereas the network shown in FIG. 5c must be implemented by more complex circuits, such as by three-level cascode circuits of the type shown in FIG. 5d.

In the network of FIG. 5b, four parallel masters 20-1, 20-2, 20-3, and 20-4 have respective data inputs D1–D4, and Q outputs $\overline{QM1}$–$\overline{QM4}$ which are connected in common through WIRE-OR gate 23 to the slave 21. The clock 22 couples level shifted clock signals to the four masters 20-1 to 20-4 and to the slave 21 by means of the level shift circuit 24. Two select inputs S1 and S2 are provided to sequence the data flow to the slave 21.

The required multiplexing circuitry formerly comprising the multiplexer 53 of FIG. 5a has been incorporated in the four masters 20-1 to 20-4. Thus a gating stage has been eliminated and the speed of the multiplexer of FIG. 5b is faster than that of FIG. 5a. The overall complexity of the circuits of FIGS. 5a and 5b may be nearly the same, in that the parts count (total transistors and resistors, etc.) for both circuits may be substantially the same. The four master, two-level cascode circuit of FIG. 5b may be used for military temperature operation ($-40°$ C. to $100°$ C.) or if power supply voltages are not held at or near a constant level. The operation of the network shown in FIG. 5b may be analyzed in a straightforward manner following the development of equations (1) through (9) given in the above. Data inputs fed to parallel transistors in masters 20-1 to 20-4. Thus, $$DM1 = S1 + S2 + D1$$

$$DM2 = S1 + S2 + D1$$

$$DM3 = S1 + S2 + D3$$

$$DM4 = S1 + S2 + D4$$

These equations are equations (1) for the specific case of the network of FIG. 5b. The master and slave latches operate in accordance with the timing defined in FIG. 3. Thus, the slave 21 operates in accordance with equation (2) and master outputs are derived in accordance with equation (3). Hence, for the network of FIG. 5, equation (3) becomes $$QM1(n+1) = DM1(n) = S1(n) + S2(n) + D1(n),$$

$$QM2(n+1) = DM2(n) = \overline{S1(n)} + S2(n) + D2(n),$$

$$QM3(n+1) = DM3(n) = S1(n) + \overline{S2(n)} + D3(n), \text{ and}$$

$$QM4(n+1) = DM4(n) = \overline{S1(n)} + \overline{S2(n)} + D4(n).$$

Master complement outputs $\overline{QM1}$, $\overline{QM2}$, $\overline{QM3}$, and $\overline{QM4}$ are WIRE-OR connected and fed to the D-input of the slave 21. Therefore, $$DS(n+1) = \overline{QM1(n+1)} + \overline{QM2(n+1)} + \overline{QM3(n+1)} + \overline{QM4(n+1)}$$

in accordance with equation (4). Hence, using equation (2) in this case yields, $$QS(n+1) = \overline{QM1(n+1)} + \overline{QM2(n+1)} + \overline{QM3(n+1)} + \overline{QM4(n+1)}$$

in accordance with equation (5).

The complement slave output $\overline{QS(n+1)}$ is used as the uncomplemented network output Q(n+1) and conversely as indicated at the right of FIG. 5b, in accordance with equation (6). Thus $$\overline{Q(n+1)} = \overline{QM1(n+1) + QM2(n+1) + QM3(n+1) + QM4(n+1)}$$

in accordance with equation (7). Equivalently using deMorgan's theorem, $$Q(n+1) = [QM1(n+1)][QM2(n+1)][QM3(n+1)][QM4(n+1)],$$

or using equation (1) for the case at hand (substituting the equations for DM1, DM2, DM3, and DM4 give above), Q(n+1) becomes $$Q(n+1) = (S1 + S2 + D1)(\overline{S1} + S2 + D2)(S1 + \overline{S2} + D3)(\overline{S1} + \overline{S2} + D4).$$

Carrying out the indicated Boolean multiplications and simplifying yields, $$Q(n+1) = \overline{S1}\,\overline{S2}\,D1 + S1\overline{S2}D2 + \overline{S1}S2D3 + S1S2D4.$$

This expression is the required selection equation for the multiplexer flip-flop and thus the circuit of FIG. 5b implements the same logic function performed by the conventional multiplexer shown in FIG. 5a.

The above analysis, carried out following equations (1–9), proves that the network shown in FIG. 5b implements the required multiplexer function. In synthesis or design as opposed to analysis, the objective is to define the appropriate network topology and to define the specific connection of input signals to network elements so that the resulting network will realize a given (required) network function. Thus, to design the network in FIG. 5b, the required selection function $$Q(n+1) = \overline{S1}\,\overline{S2}\,D1 + S1\overline{S2}D2 + \overline{S1}S2D3 + S1S2D4$$

is used as a starting point to yield at the end a network diagram as in FIG. 5b. The design may be carried out in a straight forward manner using a Karnaugh Map and the relationships developed in connections with equations (10) and (11) given above.

Figure 9:
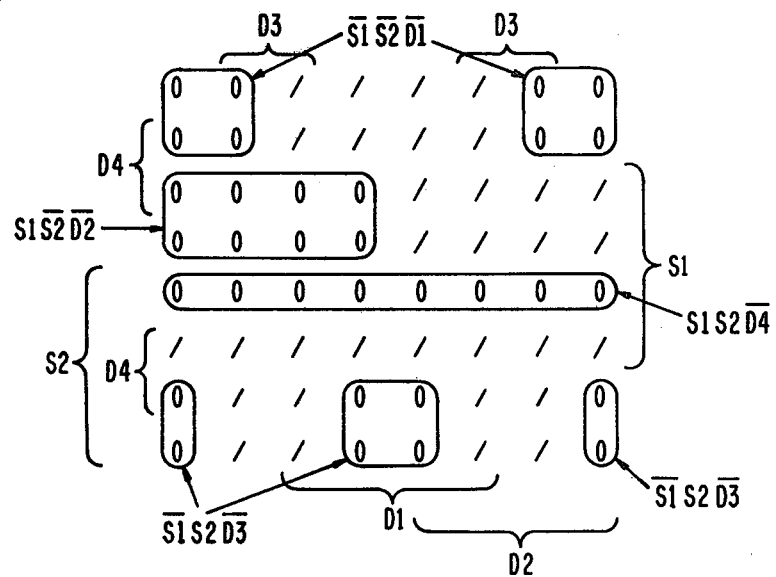
FIG. 9 is a Karnaugh map of the network function for the embodiment of FIG. 5b.

A first step in the design is to plot a Karnaugh map of the required network function. A Karnaugh map of the multiplexer selection function is given in FIG. 9. The loci of "1's" on the map together define a cover for the required selector function Q(n+1) given above. The loci of the "0's" are therefore a cover for the complement function or $\overline{Q(n+1)}$. Using the circled or boxed areas in Table 1 as a guide, an expression for $\overline{Q(n+1)}$ is derived as $$\overline{Q(n+1)} = \overline{S1}\,\overline{S2}\,\overline{D1} + S1\overline{S2}\,\overline{D2} + \overline{S1}S2\overline{D3} + S1S2\overline{D4}.$$

This equation is a sum of four product terms. Therefore, a four-master single-slave flip-flop network may be used to implement the required function. The number of masters (4) equals the number of product terms in the cover for $\overline{Q(n+1)}$.

The input variables in each product term define the inputs to each of the masters 20-1 to 20-4. As noted in the test immediately following equation (11) hereinabove, the complements of each signal in each product term are to be fed to the inputs of the masters 20-1 to 20-4. In the first product term in the above, the individual variables are $\overline{S1}$, $\overline{S2}$, and $\overline{D1}$. Accordingly, the complements of these variables or S1, S2, and D1 are to be connected as inputs to the first master 20-1. Thus, this connection is specified in FIG. 5b. Similarly, in the second product term, the variables are S1, $\overline{S2}$, and $\overline{D2}$. Therefore, the complements of these variables or $\overline{S1}$, S2, and D2 are connected to the inputs of the second master 20-2. Inputs to the third and fourth masters 20-3, 20-4 are defined in a similar manner yielding the network design shown in FIG. 5b. An analysis of this network following equations (1–9) as given above can be used as a check on the design to prove that the network implements the required function.

In the network of FIG. 5b, all gating in series with D inputs is eliminated making its speed higher than that of the conventional multiplexer of FIG. 5a. Moreover, as noted previously, with two-level cascode circuits used in master and slave latches, the network of FIG. 5b is suitable for operation over full military temperature range without untoward power supply voltage regulation.

If only operation over commercial temperature range is intended, then the same high speed operation may be obtained using the simpler lower power dissipation network FIG. 5c. The complexity and power dissipated in each master 20-1, 20-2 of FIG. 5c are approximately the same as those for each master 20-1 to 20-4 used in FIG. 5b. The slaves are identical two-level cascode circuits in both networks. Hence, power and complexity of the network of FIG. 5c are about 3/5 those of the network of FIG. 5b and the speed of both networks is comparable.

In the FIG. 5c network, the required multiplexer selector function is synthesized as the sum of two functions QM1 and QM2 given by $$QM1 = f_{M1}(D1, D2, S1, S2) = \overline{S1}\,\overline{S2}D1 + S1\overline{S2}D2 \text{ and}$$

$$QM2 = f_{M2}(D3, D4, S1, S2) = \overline{S1}S2D3 + S1S2D4.$$

These equations are equation (12), given above, for the multiplexer of FIG. 5c. Herein, the data inputs are D1–D4 and control inputs are S1 and S2. In this case, the functions $f_{M1}$ and $f_{M2}$ are mutually disjoint and thus the network of FIG. 5c operates in accordance with equation 13, so that $$Q(n+1) = QS(n+1) = QM1(n) + QM2(n).$$

Thus, slave outputs are used directly as network outputs, and as such, QS = Q and $\overline{QS} = \overline{Q}$.

Realization of the QM1 function by the network of FIG. 5d may be verified through an analysis of current flow through the circuit. As noted previously, a single current source is used in a multi-master single-slave flip-flop. Thus, only $I_Q$ or $\overline{I}_Q$ is flowing at any given time and therefore $I_Q$ and $\overline{I}_Q$ are logical complements. Also, as indicated in the preceeding discussion, voltage outputs are low when the corresponding load currents are flowing and high otherwise making voltage outputs and their corresponding load currents logical complements, such that $V_Q = \overline{I}_Q$. Consolidation of these two complement properties requires that the logic equation for complement current $\overline{I}_Q$ be identical with the logic equation for the uncomplemented voltage output $V_Q$. Consequently, $V_Q = \overline{I}_Q$ and similarly $\overline{V}_Q = I_Q$. In the circuit of FIG. 5d, $I_{Q1}$ is made up of currents $I_{A1}$ or $I_{C1}$, and thus $I_{Q1} = I_{A1} = I_{C1}$. Similarly $\overline{I}_{Q1} = I_{B1} + I_{D1}$. Analysis of the input conditions for which $I_{A1} = 1$, $I_{B1} = 1$, $I_{C1} = 1$ and $I_{D1} = 1$ and subsequent consolidation yields for the first master 20-1

$$\overline{Q}_{M1} = \overline{V}_{Q1} = I_{Q1} = I_{A1} + I_{C1} = (\overline{D1} + S2)\overline{S1} + (\overline{D2} + S2)S1$$

and $$Q_{M1} = V_{Q1} = \overline{I}_{Q1} = I_{B1} + I_{D1} = (D1\overline{S2})\overline{S1} + (D2\overline{S2})S1$$

Similarly, for the second master 20-2, the equations are $$\overline{V}_{Q2} = I_{Q2} = I_{A2} + I_{C2} = (D3 + \overline{S2})\overline{S1} + (\overline{D4} + \overline{S2})S1$$

and $$V_{Q2} = \overline{I}_{Q2} = I_{B2} + I_{D2} = (D3S2)\overline{S1} + (D4S2)S1$$

although the circuit was not specifically shown.

The composite network function of the circuit of FIG. 5c is $$DS(n) = QS(n+1) = Q(n+1) = QM1 + QM2$$
$$= D1\overline{S1}\,\overline{S2} + D1S1\overline{S2} + D3\overline{S1}S2 + D4S1S2$$

Figure 6A:
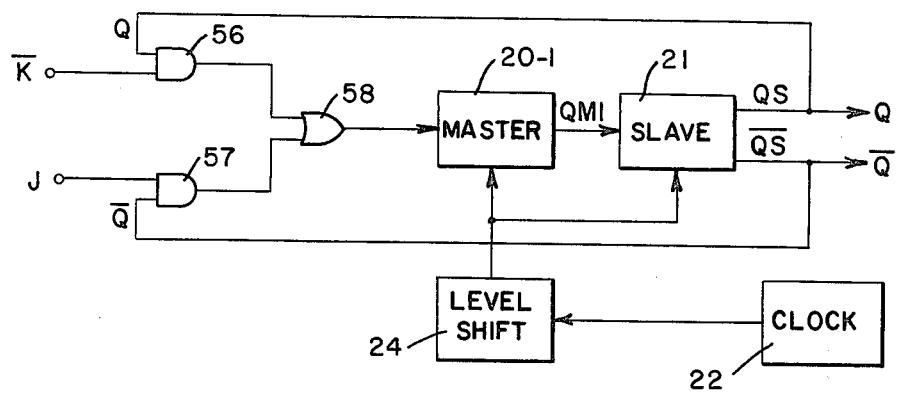
FIG. 6a shows a conventional J-K master-slave flip-flop.
Figure 6B:
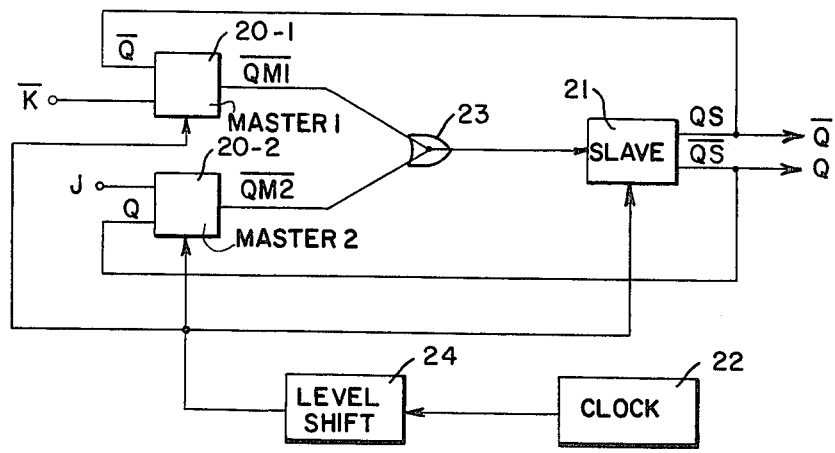
FIG. 6b shows a J-K master-slave flip-flop made in accordance with the present invention.

Referring now to FIGS. 6a and 6b there is shown a conventional J-K master-slave flip-flop and one made in accordance with the present invention which utilizes two-level cascode masters. In the network of FIG. 6b, feedback connections for the slave outputs to selected master inputs are illustrated in accordance with the general case shown in FIG. 1.

FIG. 6a includes an input gating section comprising two AND gates 56, 57 whose outputs are coupled to an OR gate 58. The output of the OR gate 58 is connected to the data input of the master 20-1. The master 20-1 has its QM1 output connected to the slave 21 which provides QS and $\overline{QS}$ outputs therefrom. The AND gate 56 has its inputs connected to the $\overline{K}$ control input and to the $\overline{QS}$ slave output. Similarly, the AND gate 57 has its inputs connected to the J control input and to the QS slave output. The clock 22 is connected through a level shift circuit 24 to the master 20-1 and the slave 21.

In contrast, FIG. 6b shows a logically equivalent J-K flip-flop made in accordance with the present invention which utilizes two-level cascode masters. The circuit of FIG. 2 is representative of a typical two-level cascode master which may be adapted for use in the circuit of FIG. 6b. Two two-level cascode masters 20-1, 20-2 have their respective Q outputs $\overline{QM1}$ and $\overline{QM2}$ WIRE-OR connected by WIRE-OR gate 23 to the slave 21. The slave outputs QS and $\overline{QS}$ are connected to the inputs of the masters 20-1 and 20-2 respectively and the $\overline{K}$ and J control inputs are also connected to the masters 20-1 and 20-2 respectively. The clock 22 is connected to the masters 20-1, 20-2 and to the slave 21 through the level shift circuit 24.

The circuit of the present invention eliminates the initial gating stage required in the conventional J-K flip-flop, and thus is a faster circuit without being more complex. The two master, one slave circuit of FIG. 6b may be used under extreme temperature and voltage situations such as demanded by military temperature design criteria. In a commercial application where no temperature or voltage problems are encountered, a single three-level cascode master single-slave circuit, such as in FIG. 4 could be adapted to perform the J-K flip-flop function.

Figure 7A:
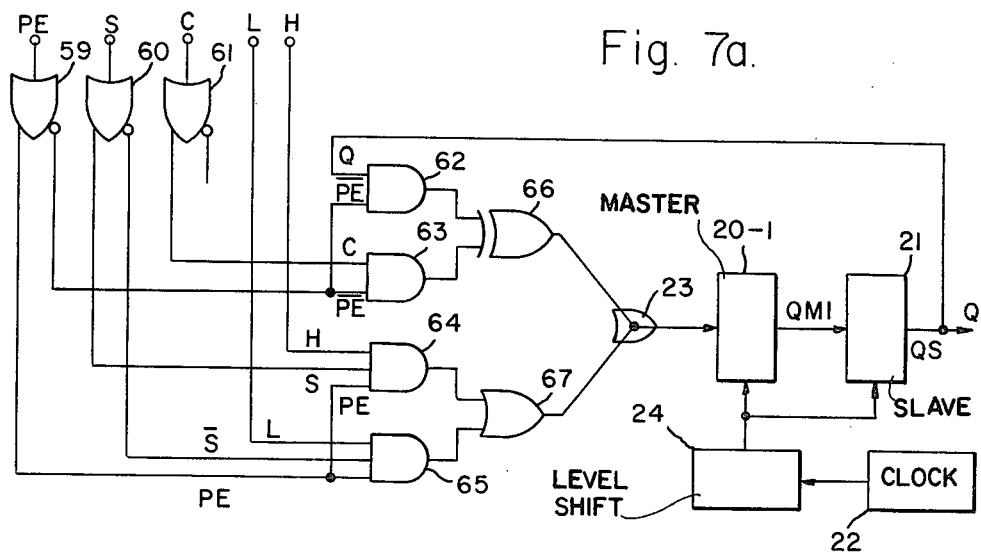
FIG. 7a shows a conventional universal counter cell.

Similarly, a universal counter cell is shown in a conventional circuit configuration in FIG. 7a and as may be constructed using the present invention in FIGS. 7b through 7e.

Considering FIG. 7a, parallel control inputs C, S and PE are connected through buffer gates 59–61, which provide both the true and complement of the control inputs to inputs of a gating stage which includes AND gates 62–65, OR gate 67 and EXCLUSIVE OR gate 66. H and L signals are connected to AND gates 64 and 65, respectively. The gating stage output is connected through the WIRE-OR gate 23 to the master 20-1 and in turn to the slave 21 and the QS output of the slave 21 is fed back to an input of the AND gate 62. The function performed by the conventional counter cell of FIG. 7a is given by $$Q(n+1) = \overline{PE}(C \oplus Q) + PE(\overline{S} \cdot L + S \cdot H).$$

Figure 7B:
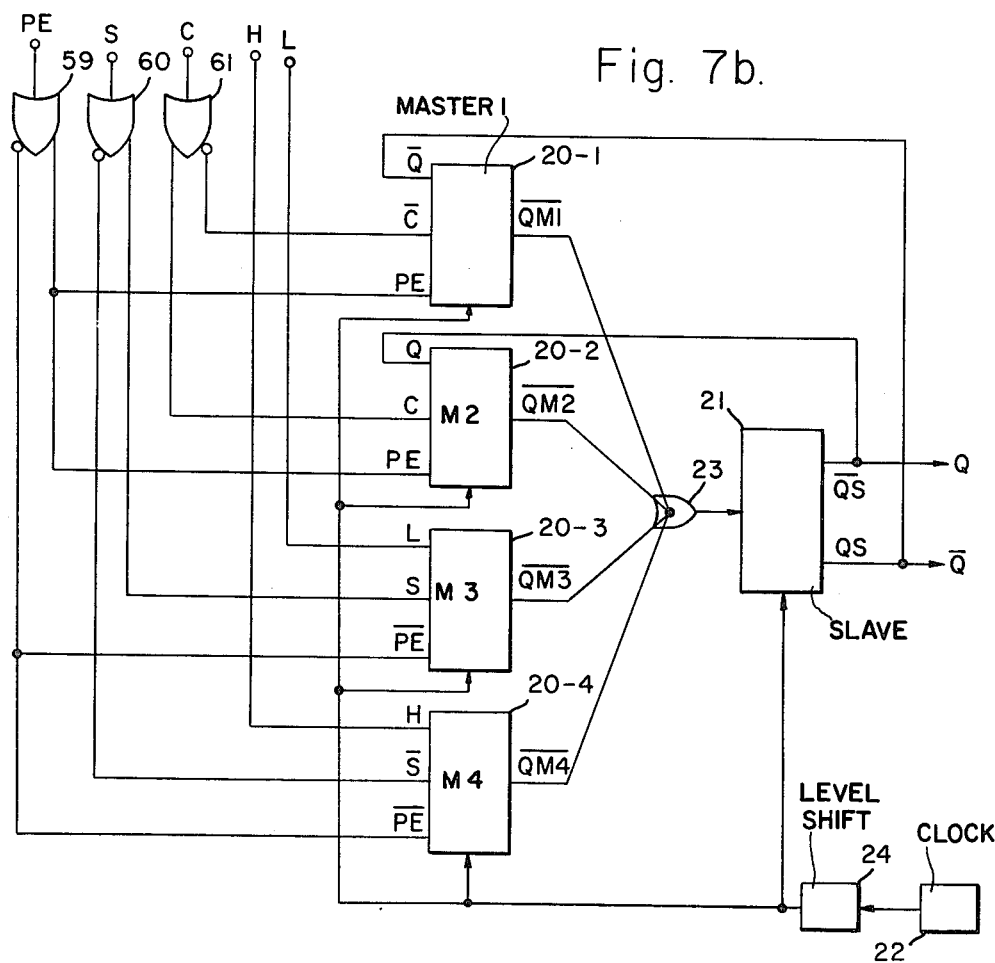
FIGS. 7b and 7c show universal counter cells made in accordance with the present invention.

Referring to FIG. 7b, the complex gating stage is eliminated by utilizing the parallel master concept of the present invention. The control inputs, including buffer gates 59–61 are the same as in FIG. 7a. However, overall operation of the circuit of the present invention is almost twice as fast as the conventional circuit. The circuit of FIG. 7b incorporates two-level cascode masters with implicit gating to accomplish the universal counter cell operation over military temperature range.

Figure 10:
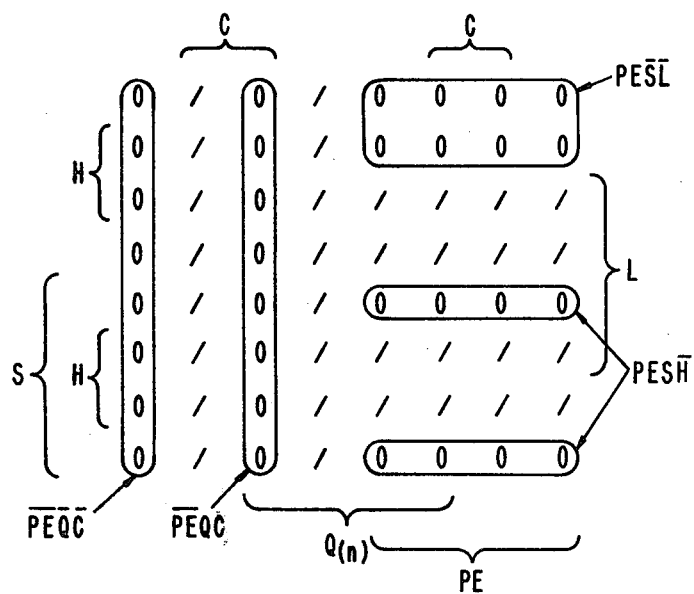
FIG. 10 is a Karnaugh map of the network function for the embodiment of FIG. 7b.

Design of the network of FIG. 7b may be accomplished in accordance with equations (10) and (11) using a Karnaugh map. In this case, a Karnaugh map plot of the required function for $Q(n+1) = \overline{PE}(C \oplus Q) + PE(\overline{S}L + SH)$ is given in FIG. 10. The zeros of the function cover $\overline{Q(n+1)}$. Factoring this cover in the manner suggested by the boxed areas in Table 2 yields the complement function expressed as $$\overline{Q(n+1)} = \overline{PE}QC + \overline{PE}\overline{Q}\overline{C} + PE\overline{SL} + PES\overline{H}.$$

This expression has four product terms. Therefore, four masters are required in the corresponding network and thus are shown in FIG. 7b. The complements of the variables in each product term are applied as master inputs. The first term is $\overline{PE}QC$. Accordingly, the complement of variables $\overline{PE}$, Q and C, i.e. PE, $\overline{Q}$ and $\overline{C}$ are input to the first master. Inputs to the remaining three masters are derived in a similar manner, yielding the network shown in FIG. 7b. An analysis following equations (1–9) similar to one describing the multiplexer of FIG. 5 may be made to verify the counter design of FIG. 7b.

As in the case of the multiplexer illustrated in FIG. 5, if the temperature range of application is suitable for three-level cascode circuit operation, then a simpler counter network design may be used. The network design shown in FIG. 7c uses two rather than four masters with the designs for the two masters shown respectively in FIGS. 7d and 7e. In this case, network realization is in accordance with equations (12) and (14) (rather than 12 and 13 for the multiplexer of FIG. 5).

Figure 7C:
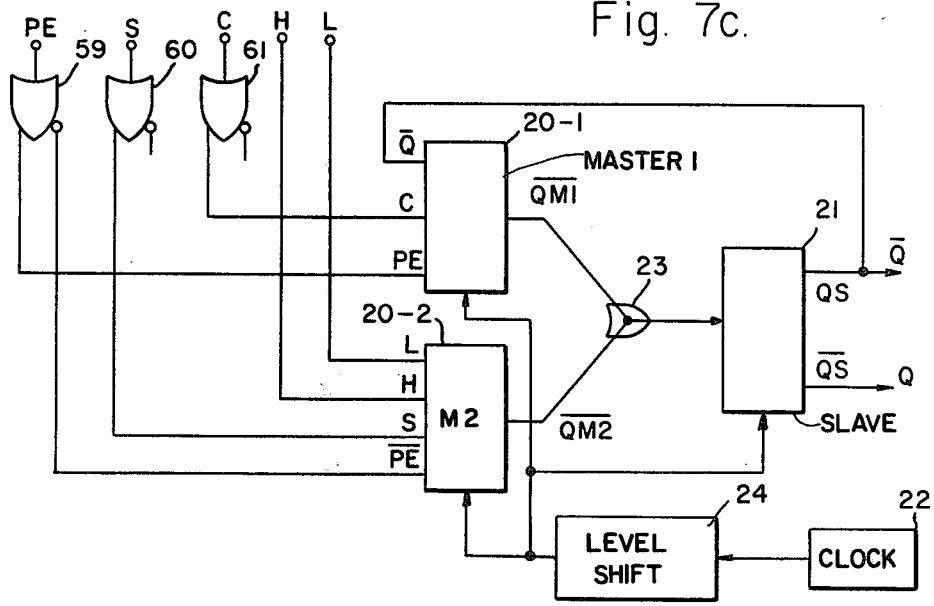

In FIG. 7c, the first master 20-1 realizes a function $QM1 = f_{M1}(Q, C, PE)$ and the second realizes $QM2 = f_{M2}(S, PE, H, L)$. The complements of these functions rather than the functions themselves are mutually disjoint. Thus, $$\overline{QM1} = \overline{PE}(Q \oplus C) \text{ and } \overline{QM2} = PE(\overline{SL} + S\overline{H})$$

are output from the masters 20-1, 20-2 respectively, and fed to the WIRE-OR gate driving the slave. Therefore, $DS(n+1) = \overline{QM1(n)} + \overline{QM2(n)} = \overline{f}_{M1}(n) + \overline{f}_{M2}(n)$. Complemented slave outputs are used as network outputs. Thus, $Q = \overline{QS}$ and $\overline{Q} = QS$ and therefore, $$Q(n+1) = \overline{QM1(n)} + \overline{QM2(n)}$$

in accordance with equation (14).

Figure 7D:
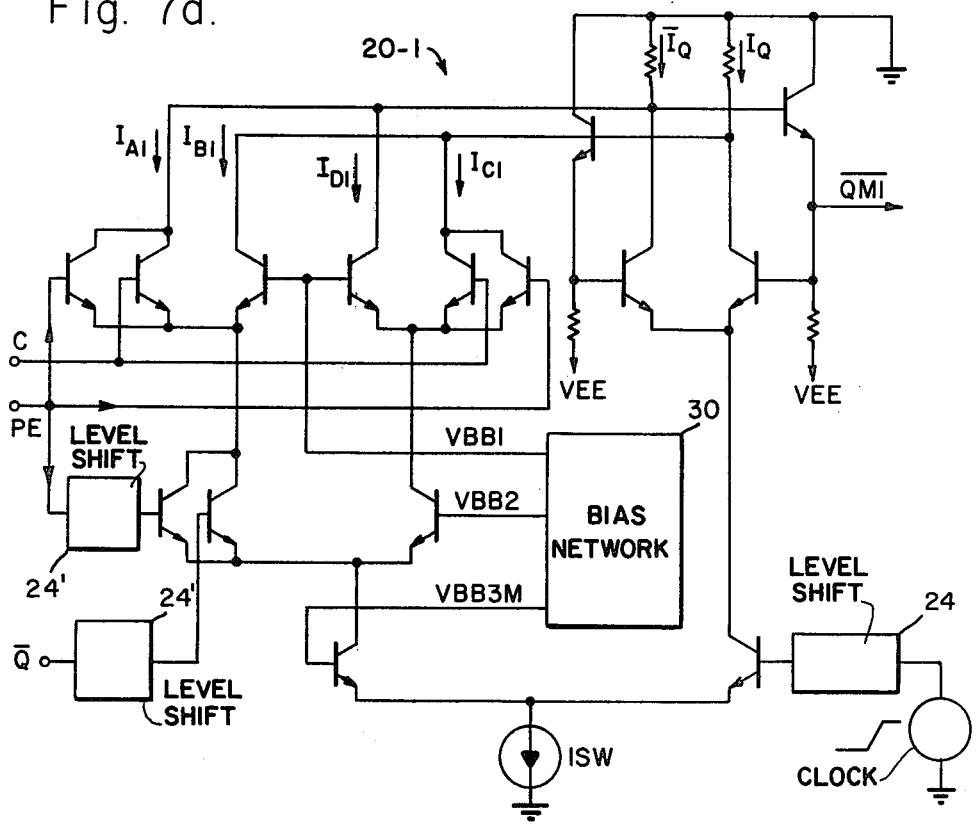
FIGS. 7d and 7e show two three-level cascode masters suitable for use in the universal counter cell of FIG. 7c.

Analysis of latch circuits of FIGS. 7d and 7e may be made to verify their realization of functions $\overline{QM1}$ and $\overline{QM2}$ in the following manner. For the first master, 20-1

$$I_{A1} = (PE + \overline{Q})(PE + C)$$

$$I_{B1} = (PE + \overline{Q})(\overline{PE + C})$$

$$I_{C1} = (\overline{PE + Q})(PE + C)$$

$$I_{D1} = (\overline{PE + Q})(\overline{PE + C})$$

so that $$\overline{I}_{QM1} = V_{QM1} = I_{A1} + I_{D1}$$
$$= (PE + \overline{Q}) \oplus (PE + C)$$

and $$I_{QM1} = \overline{V}_{QM1} = I_{B1} + I_{C1}$$
$$= (PE + \overline{Q}) \oplus (PE + C)$$

For the exclusive or function in general, $a \oplus b = \overline{a} \oplus \overline{b}$; $au \oplus av = a(u \oplus v)$; and $\overline{w} \oplus \overline{y} = \overline{w} \oplus y = w \oplus \overline{y}$, so that the last equation for $\overline{V}_{QM1}$ may be rewritten as $$(PE + \overline{Q}) \oplus (PE + C) = \overline{(PE + \overline{Q})} \oplus \overline{(PE + C)} =$$
$$\overline{PEQ} \oplus \overline{PE\overline{C}} = \overline{PE(Q \oplus \overline{C})} = \overline{PE(Q \oplus C)}.$$

Figure 7E:
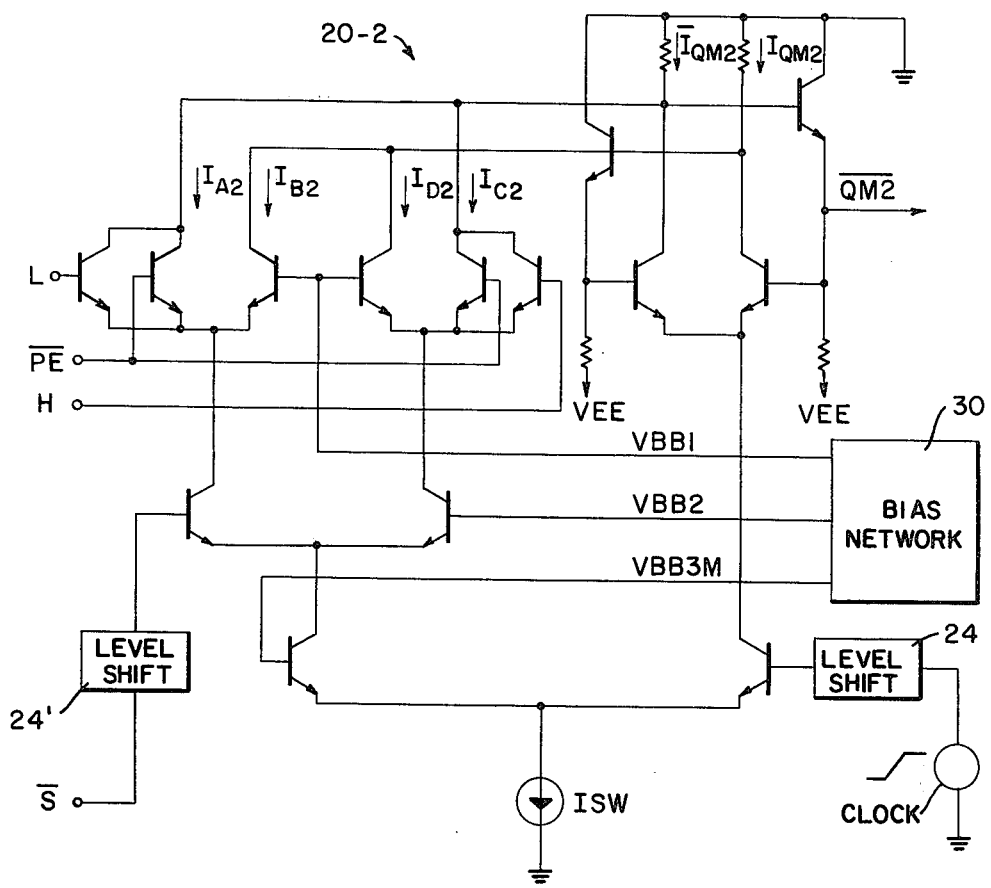

Operation of the master 20-2 shown in FIG. 7e may be evaluated in a similar manner. For this circuit, $$\overline{V}_{QM2} = I_{QM2} = I_{B2} + I_{D2}.$$

$$I_{B2} = \overline{S(\overline{PE} + L)} = \overline{S(PE\overline{L})} \text{ and}$$

$$I_{D2} = S(\overline{PE} + H) = S(PE\overline{H}) \text{ so that}$$

$$\overline{V}_{QM2} = PE(\overline{SL} + S\overline{H}) \text{ as required.}$$

Figure 8:
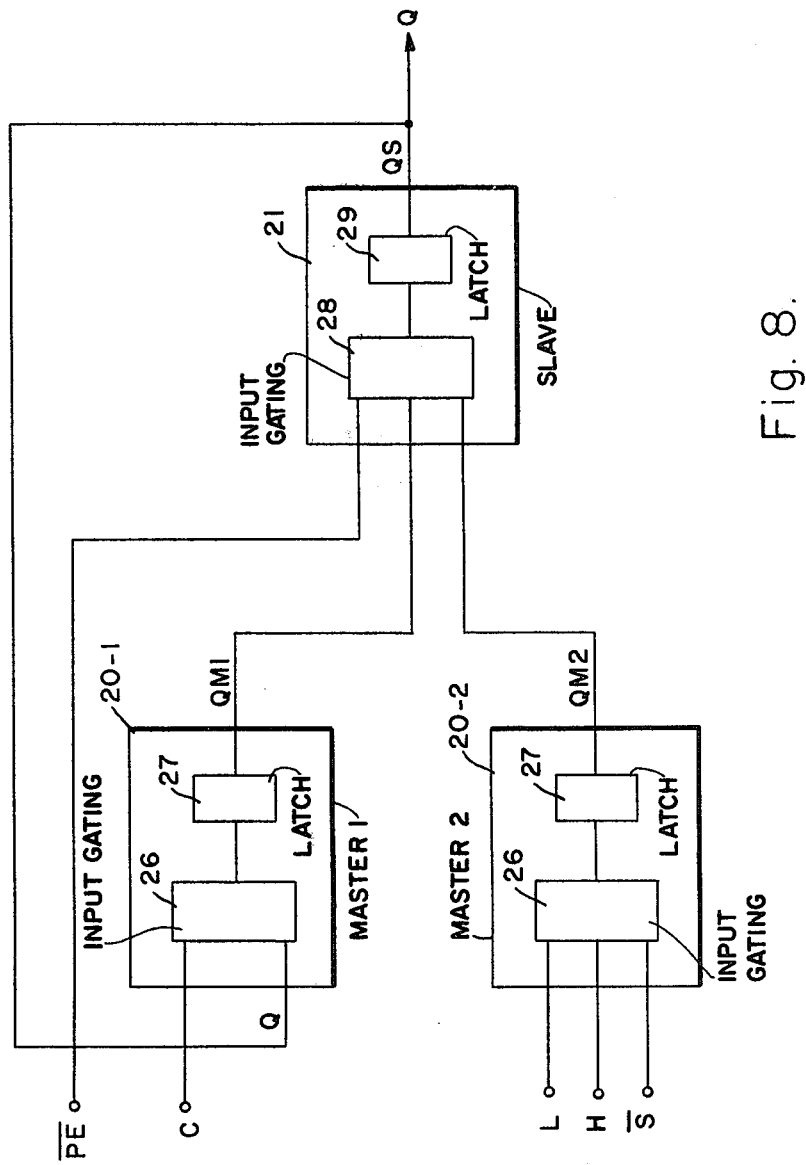
FIG. 8 shows an embodiment of the universal counter cell made in accordance with the present invention which incorporates both three-level cascode masters and slave allowing implicit input gating therein.
Figure 8A:
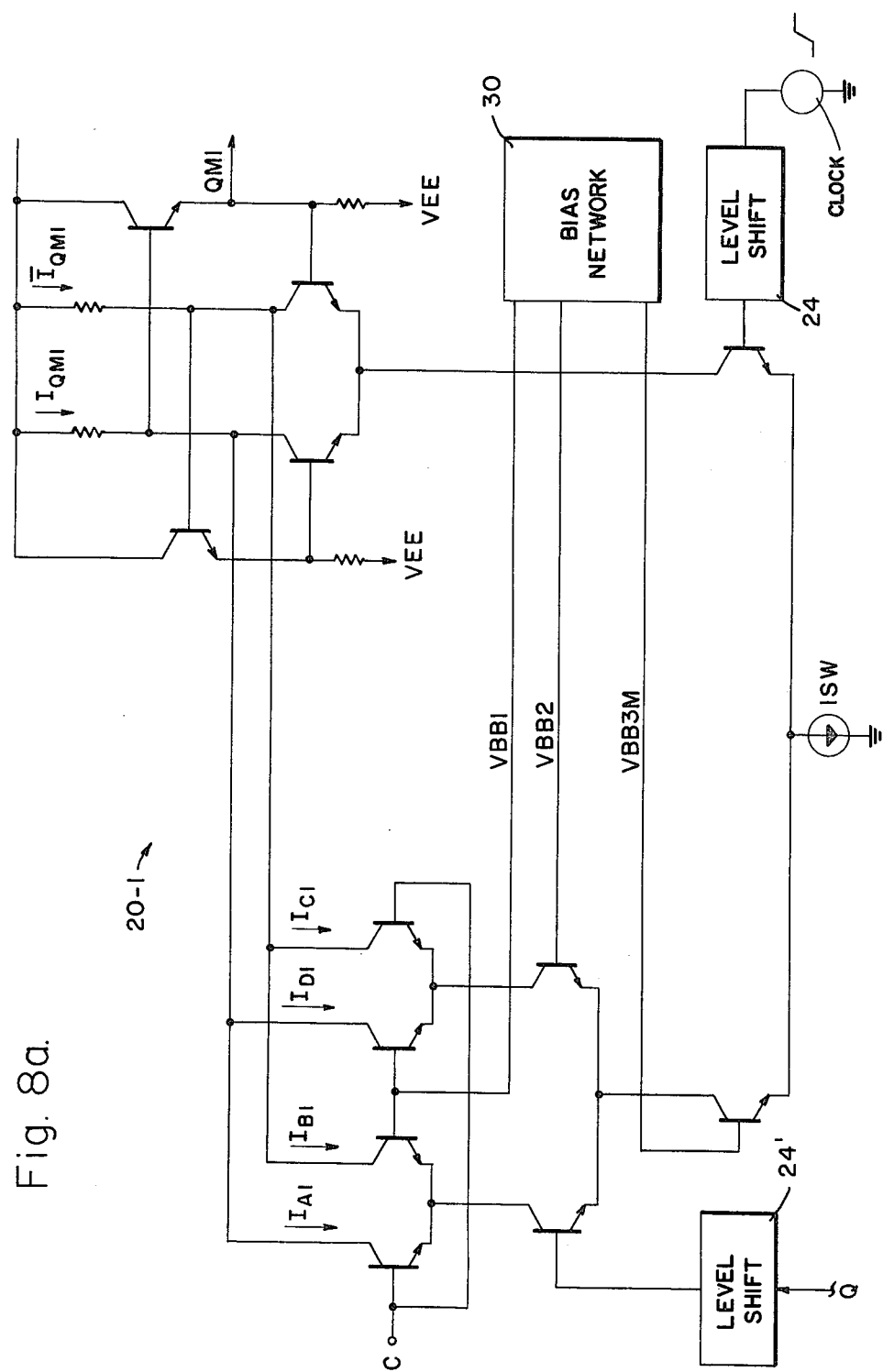
FIG. 8a shows a three-level cascode master for use in the universal counter cell of FIG. 8.
Figure 8B:
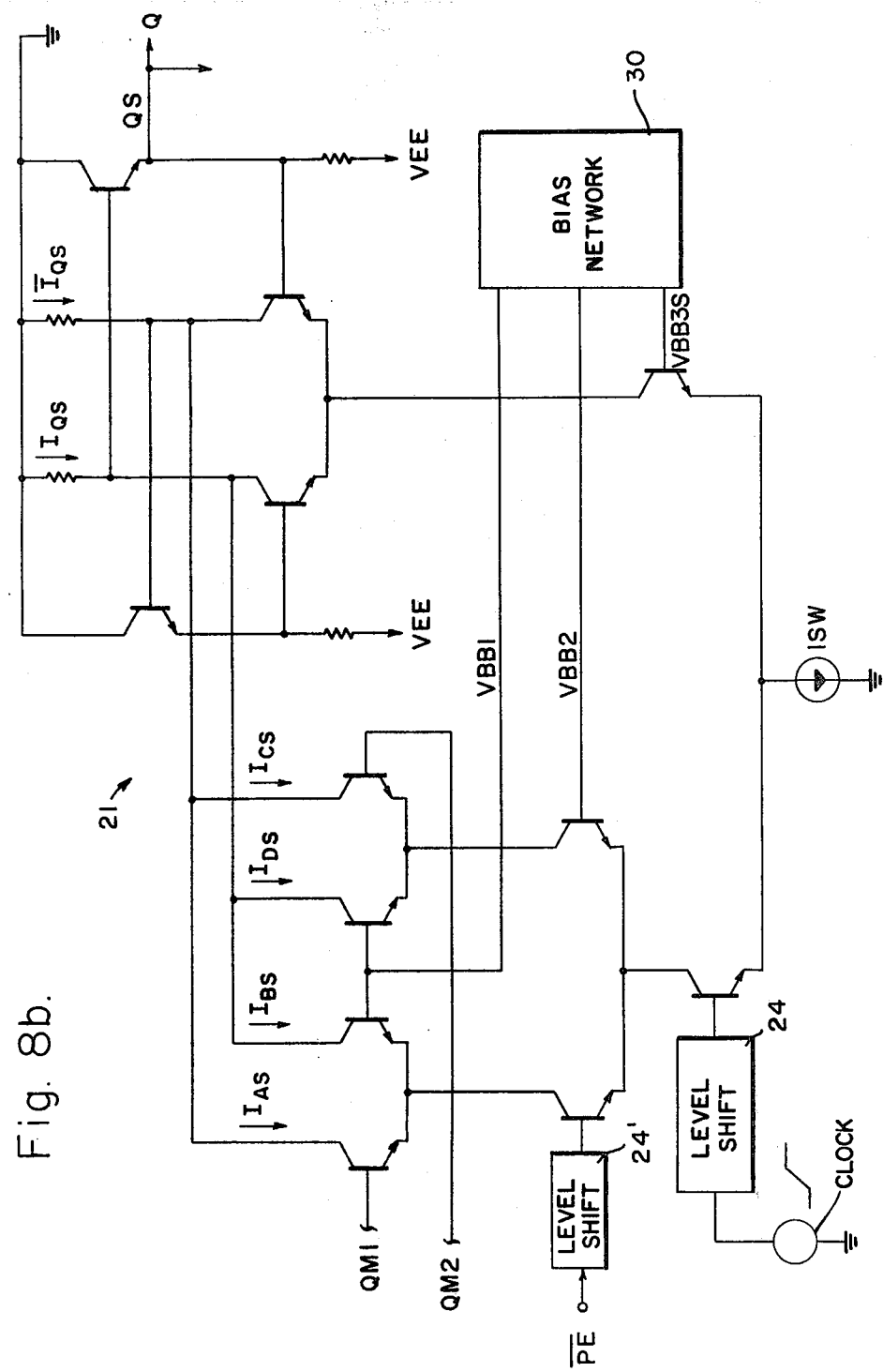
FIG. 8b shows a three-level cascode slave for use in the universal counter cell of FIG. 8.

In the networks described thusfar, in accordance with the invention, only two-level cascode slaves have been used. As indicated in the preceeding discussion in connection with equations (15) and (16), more general networks may be realized in which three-level cascode slave latch elements are used to implement non-trivial slave input logic functions $F_S$. One such network is illustrated in FIG. 8. A network design is given in FIG. 8a while the circuit designs for master and slave elements are presented in FIGS. 8b and 8c. To simplify the discussion, the function chosen for realization by the network of FIG. 8a is the same universal counter function implemented by the networks described previously in FIG. 7. However, in FIG. 8, simplified masters are used along with a three-level cascode slave circuit as indicated in FIGS. 8b and 8c. In a general case, implementation of more complex networks may be improved substantially by using three-level cascode slave circuits. However, in the network of FIG. 8, the performance, complexity and power dissipation are approximately the same as in the network of FIG. 7c.

In connection with the design of FIG. 8a, the counter network function is expressed as $$Q(n+1) = F_S(f_{M1}, f_{M2}) = \overline{PE}f_{M1} + PEf_{M2}$$

in accordance with equation (15), where $$f_{M1} = Q_{M1} = Q \oplus C \text{ and}$$

$$f_{M2} = Q_{M2} = \overline{S}L + SH,$$

in accordance with equation (12).

Thus, M1 and M2 outputs and input variable $\overline{PE}$ are fed to slave inputs as shown in FIG. 8a. Then master and slave implement the functions QM1, QM2 and $F_S$ as given above. Analysis of FIG. 8a indicates that $$V_{QM1} = \overline{I}_{QM1} = I_{B1} + I_{C1} = Q\overline{C} + \overline{Q}C = Q \oplus C.$$

Analysis of FIG. 8b yields $$V_{QS} = \overline{I}_{QS} = I_{AS} + I_{CS} = \overline{PE}QM1 + PEQM2$$

as required. By analogy with FIG. 5, the second master 20-2 realizes $V_{QM2} = \overline{S}L + SH$.

In commercial applications, three-level cascode circuits may be used with 5.2 volt power supply voltages standard for ECL circuits. In special applications power supply voltage may be reduced to 3 volts, which lowers on-chip IC power dissipation. Under these circumstances, only single level current-switch (CS) and current-switch emitter-follower (CSEF) circuits may be used. With a 3 volt power supply voltage, all flip-flop circuits must be built using multi-stage CS and CSEF networks. Then many different master input functions may be embedded in the flip-flop without further increasing delay or perhaps power dissipation. In this case as in those cited previously, overall (input gating plus flip-flop) network performance may be improved through alternate multi-master single-slave flip-flop realization of a network function. The delay through each element is fixed by circuit constraints in every case. However, control input gating in series with flip-flop inputs in conventional networks is simplified or eliminated in logically equivalent multi-master single-slave flip-flops.

Thus, we have described an improved multi-master single-slave flip-flop arrangement which provides for coupling a plurality of master latches to implement a variety of circuit functions.

It is to be understood that the above-described embodiments of the invention are merely illustrative of the many possible specific embodiments which represent applications of the principles of the present invention. Numerous and varied other arrangements may readily be devised in accordance with these principles by those skilled in the art without departing from the spirit and scope of the invention.

What is claimed is:

1. A multi-master single-slave flip-flop comprising:
a plurality of master flip-flops, each of said master flip-flops having a plurality of data inputs, a clock input and two outputs, each of said master flip-flops comprising a two-level cascode circuit of the emitter coupled logic type including a lower current switch coupled to two upper current switches and a latch circuit;
a slave flip-flop having a plurality of data inputs, a clock input and two outputs, said slave flip-flop comprising an internal input gating circuit and a two-level cascode circuit of the emitter coupled logic type including a lower current switch coupled to two upper current switches and a latch circuit;
one output of each of said master flip-flops being connected to a data input of said slave flip-flop, the outputs of each of said master flip-flops being discretionarily connected to the inputs of said master flip-flops, said slave flip-flop outputs being discretionarily connected to the data inputs of said master flip-flops and said slave flip-flop;
said one output of each of said master flip-flops being selected such that with given data signals the combination of said master flip-flops and said input gating circuit of said slave flip-flop applies a logic-one level signal to the cascode circuit of said slave flip-flop at any given time; and
a clock coupled to the clock inputs of said master flip-flops and said slave flip-flop for providing clock signals thereto;
said master flip-flops and said slave flip-flop being substantially identical circuits differing in that the bias voltage applied to the lower current switches of said master flip-flops is approximately 100 millivolts lower than the bais voltage applied to the lower current switch of said slave flip-flop, and in that said clock signals are applied to opposite sides of the lower current switches of said slave flip-flop and said master flip-flops to provide master flip-flop, then slave flip-flop release timing at positive clock signal edges, and then slave flip-flop lock-up, then master flip-flop release at negative clock signal edges.

2. A multiplexer master-sleeve flip-flop comprising:
four master flip-flops, each of said master flip-flops having a data signal input, a select signal input, a clock input and two outputs, each of said master flip-flops comprising a two-level cascode circuit of the emitter coupled logic type including a lower current switch coupled to two upper current switches and a latch circuit;
a single slave flip-flop having a single data input, a clock input and two outputs, said slave flip-flop comprising a two-level cascode circuit of the emitter coupled logic type including a lower current switch coupled to two upper current switches and a latch circuit;

one output of each of said master flip-flops being connected to the input of said slave flip-flop, the particular output of said master flip-flops connected to the input of said slave flip-flop being selected such that with given data signals and select signals, not more than one of said master flip-flops applies a logic-one level signal to said slave flip-flop at any given time; and a clock coupled to the clock inputs of said master flip-flops and said slave flip-flop for providing clock signals thereto;

said master flip-flops and said slave flip-flop being substantially identical circuits differing in that the bias voltage applied to the lower current switches of said master flip-flops is approximately 100 millivolts lower than the bias voltage applied to the lower current switch of said slave flip-flop, and in that said clock signals are applied to opposite sides of the lower current switches of said slave flip-flop and said master flip-flops to provide master flip-flop lock-up, then slave flip-flop release timing at positive clock signal edges, and then slave flip-flop lock-up, then master flip-flop release at negative clock signal edges.

3. A J-K master-slave flip-flop comprising:

two master flip-flops, each of said master flip-flops having two data signal inputs, a clock input and two outputs, each of said master flip-flops comprising a two-level cascode circuit of the emitter coupled logic type including a lower current switch coupled to two upper current switches and a latch circuit;

a single slave circuit having a single data input, a clock input and two outputs, said slave flip-flop comprising a two-level cascode circuit of the emitter coupled logic type including a lower current switch coupled to two upper circuit switches and a latch circuit;

one output of each of said master flip-flops being connected to the input of said slave flip-flop, one of said outputs of said slave flip-flop being fed back to one input of one of said master flip-flops, the other of said outputs of said slave flip-flop being fed back to one input of the other of said master flip-flops, the particular output of said master flip-flops connected to the input of said slave flip-flop being selected such that with given data signals and slave flip-flop output signals, not more than one of said master flip-flops applies a logic-one level signal to said slave flip-flop at any given time; and a clock coupled to the clock inputs of said master flip-flops and said sleeve flip-flop for providing clock signals thereto;

said master flip-flops and said slave flip-flop being substantially identical circuits, differing in that the bias voltage applied to the lower circuit switches of said master flip-flops is approximately 100 millivolts lower than the bias voltage applied to the lower current switch of said slave flip-flop, and in that said clock signals are applied to opposite sides of the lower current switches of said slave flip-flop and said master flip-flops to provide master flip-flop lock-up, then slave flip-flop release timing at positive clock signal edges, and then slave flip-flop lock-up, then master flip-flop release at negative clock signal edges.

4. A universal counter cell, comprising:

four master flip-flops, each of said master flip-flops having three data inputs, a clock input and two outputs, each of said master flip-flops comprising a two-level cascode circuit of the emitter coupled logic type including a lower current switch coupled to two upper current switches and a latch circuit;

a single slave flip-flop having a single data input, a clock input and two outputs Q and $\overline{Q}$, said slave flip-flop comprising a two-level cascode circuit of the emitter coupled logic type including a lower current switch coupled to two upper current switches and a latch circuit;

control signals includng parallel entry (PE) and its complement ($\overline{PE}$), select (S) and its complement ($\overline{S}$), count control (C) and its complement ($\overline{C}$), high signal (H) and low signal (L);

said data inputs of said master flip-flops being connected to said control signals and said slave flip-flop outputs such that PE, $\overline{C}$ and $\overline{Q}$ are connected to the data inputs of the first master flip-flop; PE, C and Q are connected to the data inputs of the second master flip-flop; $\overline{PE}$, S and L, are connected to the data inputs of the third master flip-flop; and $\overline{PE}$, $\overline{S}$ and H are connected to the data inputs of the fourth master flip-flop;

one output of each of said master flip-flops being connected to the input of said slave flip-flip, the particular output of said master flip-flops connected to the input of said slave flip-flop being selected such that with given data signals, not more than one of said master flip-flops applies a logic-one level signal to said slave flip-flop at any given time; and a clock coupled to the clock inputs of said master flip-flops and said slave flip-flop for providing clock signals thereto;

said master flip-flops and said slave flip-flop being substantially identical circuits differing in that the bias voltage applied to the lower current switch of said master flip-flops is approximately 100 millivolts lower than the bias voltage applied to the lower current switch of said slave flip-flop, and in that clock signals are applied to opposite sides of the lower current switches of said slave flip-flop and said master flip-flops to provide master flip-flop lock-up, then slave flip-flop release timing at positive clock signal edges, and then slave flip-flop lock-up, then master flip-flop release at negative clock signal edges.

5. A multi-master single-slave flip-flop arrangement which comprises a plurality of master flip-flops and a slave flip-flop, each of said master flip-flops having a plurality of data and control signal inputs and true and complement outputs, said slave flip-flop having a signal input and true and complement outputs, each of said master and slave flip-flops including gating circuitry and latch circuitry which implements particular true or complement logic functions of input signals applied thereto, wherein the improvement comprises:

said slave flip-flop having a plurality of data and control signal inputs coupled to the gating circuitry thereof;

said master flip-flops having preselected ones of the outputs thereof connected to preselected data and control signal inputs of said slave flip-flop;

said arrangement having at least one of the outputs of said slave flip-flop connected to at least one of the inputs of at least one of said master flip-flops to provide for feedback between said slave flip-flop and said master flip-flop to control the mode of operation of said master flip-flop or to affect the output state of the logic functions performed by said gating circuitry of said master flip-flop;

said arrangement having preselected data and control signals coupled to preselected ones of the data and control signal inputs of said master flip-flops; and the outputs of said arrangement being provided by preselected ones of the outputs of said slave flip-flop.

6. The arrangement of claim 5 wherein said slave flip-flop includes gating circuitry which implements complex logic functions of signals applied thereto.

7. The arrangement of claims 5 wherein said slave flip-flop includes gating circuitry having at least three level cascode circuitry which implements complex logic functions of signals applied thereto.

8. The arrangement of claim 5 wherein at least one input of said slave flip-flop has a plurality of master flip-flop outputs connected thereto in a WIRE-OR manner and wherein the remaining inputs of said slave flip-flop are connected to preselected ones of said master flip-flop outputs, the gating circuitry of said slave flip-flop implementing complex logic functions of signals applied thereto.

9. The arrangement of claim 5 wherein at least one of said master flip-flops includes gating circuitry which implements complex logic functions of signals applied thereto.

10. The arrangement of claim 5 wherein at least one of said master flip-flops includes gating circuitry having at least three level cascode circuitry which implements complex logic functions of signals applied thereto.

11. A multi-master signal-slave flip-flop arrangement which includes a plurality of master flip-flops and a slave flip-flop, each of said master flip-flops having a plurality of data inputs, a clock input, and true and complement outputs, said slave flip-flop having a data input, a clock input, and true and complement outputs, said master flip-flops and said slave flip-flop each including input gating circuitry coupled to latch circuitry which implements particular true or complement logic functions of data signals applied thereto, wherein the improvement comprises:

said slave flip-flop having said data input and a plurality of additional data inputs coupled to the gating circuitry thereto;

each of said master flip-flops having at least one control input coupled to the gating circuitry thereof;

whereby in response to preselected data and control input signals applied to said master and slave flip-flops and discretionary feedback signals applied between flip-flops, a selected one of a plurality of circuit configurations is provided as said arrangement.

12. A multi-master single-slave flip-flop arrangement comprising:

a plurality of master flip-flops, each of said master flip-flops having a plurality of data and control signal inputs and complementary outputs;

a slave flip-flop having a plurality of data and control signal inputs and complementary outputs;

one output of each of said master flip-flops being connected to a preselected one of the inputs of said slave flip-flop, and preselected outputs of said slave flip-flop being discretionarily connected to preselected ones of the inputs of said master flip-flops in a feedback manner, in that the output of each of said master flip-flops is selected such that with given input signals and feedback signals, only one of said master flip-flops applies a logic-one level signal to said slave circuit at any given time; and timing means coupled to said master and slave flip-flops for providing timing signals thereto which control master and slave lock-up and release timing.

13. A multi-master single-slave flip-flop arrangement which comprises a plurality of master flip-flops and a slave flip-flop each of said master flip-flops having a plurality of data and control signal inputs and true and complement outputs, said slave flip-flop having a data signal input and true and complement outputs, each of said master and slave flip-flops including gating circuitry and latch circuitry which implements particular true or complement logic functions of input signals applied thereto, wherein the improvement comprises:

said slave flip-flop having a plurality of data and control inputs coupled to the gating circuitry thereof;

one output of each of said master flip-flops being connected to a preselected one of the inputs of said slave flip-flop, and preselected outputs of said slave flip-flop being discretionarily connected to preselected ones of the inputs of said master flip-flops in a feedback manner, in that the output of each of said master flip-flops is selected such that with given input signals and feedback signals, only one of said master flip-flops applies a logic-one level signal to said slave circuit at any given time; and timing means coupled to said master and slave flip-flops for providing timing signals thereto which control master and slave lock-up and release timing.

14. A multi-master signal-slave flip-flop arrangement which comprises a plurality of master flip-flops and a slave flip-flop, each of said master flip-flops having a plurality of data and control signal inputs and true and complement outputs, said slave flip-flop having a signal input and true and complement outputs, each of said master and slave flip-flops including gating circuitry and latch circuitry which implements particular true or complement logic functions of input signals applied thereto, wherein the improvement comprises:

said slave flip-flop having a plurality of data and control signal inputs coupled to the gating circuitry thereof;

said master flip-flops having preselected ones of the outputs thereof connected to preselected data and control signal inputs of said slave flip-flop;

said arrangement having at least one input of said slave flip-flop with a plurality of master flip-flop outputs connected thereto in a WIRE-OR manner and wherein the remaining inputs of said slave flip-flop are connected to preselected ones of said master flip-flop outputs, the gating circuitry of said slave flip-flop implementing complex logic functions of signals applied thereto;

said arrangements having preselected data and control signals coupled to preselected ones of the data and control signal inputs of said master flip-flops; and the outputs of said arrangement being provided by preselected ones of the outputs of said slave flip-flop.

* * * * *